United States Patent
Ashworth et al.

(12)

(10) Patent No.: US 10,424,822 B2
(45) Date of Patent: Sep. 24, 2019

(54) MULTI-COMMON PORT MULTIBAND FILTERS

(71) Applicant: WILSON ELECTRONICS, LLC, St. George, UT (US)

(72) Inventors: Chris Ashworth, St. George, UT (US); Patrick Cook, Cedar City, UT (US)

(73) Assignee: WILSON ELECTRONICS, LLC, St. George, UT (US)

( * ) Notice: Subject to any disclaimer, the term of this patent is extended or adjusted under 35 U.S.C. 154(b) by 0 days.

(21) Appl. No.: 15/959,088

(22) Filed: Apr. 20, 2018

(65) Prior Publication Data

US 2018/0241109 A1     Aug. 23, 2018

Related U.S. Application Data

(63) Continuation-in-part of application No. 15/291,763, filed on Oct. 12, 2016.
(Continued)

(51) Int. Cl.
*H04B 7/155* (2006.01)
*H04W 88/04* (2009.01)
(Continued)

(52) U.S. Cl.
CPC ........ *H01P 1/2133* (2013.01); *H01P 1/20327* (2013.01); *H04B 1/00* (2013.01);
(Continued)

(58) Field of Classification Search
CPC ............ H04B 7/15535; H04B 7/15542; H04B 7/15557; H04W 52/0229; H04W 88/04;
(Continued)

(56) References Cited

U.S. PATENT DOCUMENTS

| 2,279,506 A | 4/1942 | Reid |
| 3,332,038 A | 7/1967 | Stanley et al. |
(Continued)

FOREIGN PATENT DOCUMENTS

| EP | 152678 B1 | 7/2008 |
| GB | 720378 A | 12/1954 |
(Continued)

OTHER PUBLICATIONS

ADL5513; "1 MHz to 4 GHz, 80 dB Logarithmic Detector / Controller"; Data Sheet; (2008); 25 pages.
(Continued)

*Primary Examiner* — Philip Sobutka
(74) *Attorney, Agent, or Firm* — Thorpe North & Western

(57) ABSTRACT

A technology for a dual-common port multi-bandpass filter is described. The dual-common port multi-bandpass filter can include two or more analog filters. The dual-common port multi-bandpass filter can include a first common port coupled to an input of each of the two or more analog filters. Each analog filter can be configured to filter one or more frequency bands. The dual-common port multi-bandpass filter can include a second common port coupled to an output of each of the two or more analog filters. Each input of each of the two or more analog filters is impedance matched with the first common port. Each output of each of the two or more analog filters is impedance matched with the second common port.

28 Claims, 19 Drawing Sheets

Related U.S. Application Data

(60) Provisional application No. 62/241,279, filed on Oct. 14, 2015.

(51) Int. Cl.
*H01P 1/213* (2006.01)
*H01P 1/203* (2006.01)
*H04B 1/00* (2006.01)
*H03H 7/01* (2006.01)
*H01P 1/202* (2006.01)

(52) U.S. Cl.
CPC ..... *H04B 7/15535* (2013.01); *H04B 7/15542* (2013.01); *H01P 1/202* (2013.01); *H03H 7/0115* (2013.01); *H04B 1/0057* (2013.01); *H04B 7/15557* (2013.01); *H04W 88/04* (2013.01)

(58) Field of Classification Search
CPC .............. Y02D 70/1262; Y02D 70/142; Y02D 70/144; Y02D 70/146; Y02D 70/164; Y02D 70/166; Y02D 70/446
USPC ..................................................... 455/7–25
See application file for complete search history.

(56) References Cited

U.S. PATENT DOCUMENTS

| | | |
|---|---|---|
| 4,776,032 A | 10/1988 | Odate et al. |
| 5,303,395 A | 4/1994 | Dayani |
| 5,737,687 A | 4/1998 | Martin et al. |
| 5,777,530 A | 7/1998 | Nakatuka |
| 5,809,398 A | 9/1998 | Moberg et al. |
| 5,835,848 A | 11/1998 | Bi et al. |
| 6,005,884 A | 12/1999 | Cook et al. |
| 6,041,216 A | 3/2000 | Rose et al. |
| 6,615,021 B1 | 9/2003 | Lovinggood et al. |
| 6,690,916 B1 | 2/2004 | Yenerim |
| 6,711,388 B1 | 3/2004 | Neitiniemi |
| 6,889,033 B2 | 5/2005 | Bongfeldt |
| 6,990,313 B1 | 1/2006 | Yarkosky |
| 7,035,587 B1 | 4/2006 | Yarkosky |
| 7,221,967 B2 | 5/2007 | Van Buren et al. |
| 7,974,573 B2 | 7/2011 | Dean |
| 7,986,647 B2 | 7/2011 | Ghadaksaz |
| 8,380,136 B2 | 2/2013 | Nast et al. |
| 8,867,572 B1 | 10/2014 | Zhan |
| 2002/0044594 A1 | 4/2002 | Bongfeldt |
| 2003/0073423 A1 | 4/2003 | Cho |
| 2003/0123401 A1 | 7/2003 | Dean |
| 2004/0137854 A1 | 7/2004 | Ge |
| 2004/0146013 A1 | 7/2004 | Song et al. |
| 2004/0166802 A1 | 8/2004 | McKay, Sr. et al. |
| 2004/0219876 A1 | 11/2004 | Baker et al. |
| 2004/0235417 A1 | 11/2004 | Dean |
| 2004/0246074 A1 | 12/2004 | Humphrey |
| 2005/0026571 A1 | 2/2005 | Yang et al. |
| 2005/0118949 A1 | 6/2005 | Allen et al. |
| 2006/0019603 A1 | 1/2006 | Pergal |
| 2006/0084379 A1 | 4/2006 | O'Neill |
| 2006/0205442 A1 | 9/2006 | Phillips et al. |
| 2007/0071128 A1 | 3/2007 | Meir et al. |
| 2007/0087715 A1 | 4/2007 | Mimura et al. |
| 2007/0188235 A1 | 8/2007 | Dean |
| 2007/0202826 A1 | 8/2007 | Dean |
| 2007/0218951 A1 | 9/2007 | Risheq et al. |
| 2008/0081555 A1 | 4/2008 | Kong et al. |
| 2008/0096483 A1 | 4/2008 | Van Buren et al. |
| 2008/0212500 A1 | 9/2008 | Zhen et al. |
| 2008/0212502 A1 | 9/2008 | Zhen et al. |
| 2008/0267112 A1 | 10/2008 | Lucidarme |
| 2008/0278237 A1 | 11/2008 | Blin |
| 2009/0086655 A1* | 4/2009 | Ghadaksaz .............. H01Q 1/22 370/293 |
| 2009/0122842 A1 | 5/2009 | Vavik |
| 2009/0289739 A1 | 11/2009 | Sasaki et al. |
| 2010/0118922 A1 | 5/2010 | Ahn |
| 2010/0151917 A1 | 6/2010 | Wilson |
| 2011/0070824 A1 | 3/2011 | Braithwaite |
| 2011/0085477 A1 | 4/2011 | Schiff |
| 2011/0116439 A1 | 5/2011 | Kawasaki |
| 2011/0147920 A1 | 6/2011 | Choudhury et al. |
| 2011/0151775 A1 | 6/2011 | Kang et al. |
| 2012/0002586 A1 | 1/2012 | Gainey et al. |
| 2012/0281550 A1 | 11/2012 | Huang |
| 2012/0315894 A1 | 12/2012 | Dussmann |
| 2012/0329523 A1 | 12/2012 | Stewart et al. |
| 2014/0050212 A1 | 2/2014 | Braz et al. |
| 2014/0064730 A1 | 3/2014 | Ko |
| 2014/0065948 A1 | 3/2014 | Huang |
| 2014/0169501 A1 | 6/2014 | Nazarathy et al. |
| 2014/0266424 A1 | 9/2014 | Ashworth et al. |
| 2015/0038097 A1 | 2/2015 | Lindoff et al. |
| 2015/0079898 A1 | 3/2015 | Pergal |
| 2015/0244450 A1 | 8/2015 | Wajcer et al. |
| 2015/0296515 A1 | 10/2015 | Pehlivanoglu |
| 2016/0006415 A1 | 1/2016 | Takematsu |
| 2016/0126987 A1 | 5/2016 | Wloczysiak |
| 2017/0160370 A1 | 6/2017 | Yakubisin et al. |

FOREIGN PATENT DOCUMENTS

| | | |
|---|---|---|
| GB | 952223 A | 3/1964 |
| JP | H08-256101 A | 10/1996 |
| WO | WO 2009046228 A1 | 4/2009 |

OTHER PUBLICATIONS

HMC713LP3E; "54 dB, Logarithmic Detector / Controller, 50—8000 MHz"; Data Sheet; (2010); 12 pages.

HMC909LP4E; "RMS Power Detector Single-Ended, DC—5.8 GHz"; Data Sheet; (2010); 21 pages.

PIC16F873; "28/40-Pin 8-Bit CMOS Flash Microcontrollers"; Data Sheet; (2001); 218 pages.

3GPP2 C.S0011-B; "Recommended Minimum Performance Standards for cdma2000® Spread Spectrum Mobile Stations"; TIA-98-E; (Dec. 13, 2002); 448 pages; Release B, Version 1, Revision E.

* cited by examiner

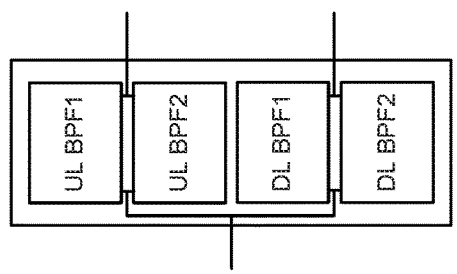
FIG. 17A
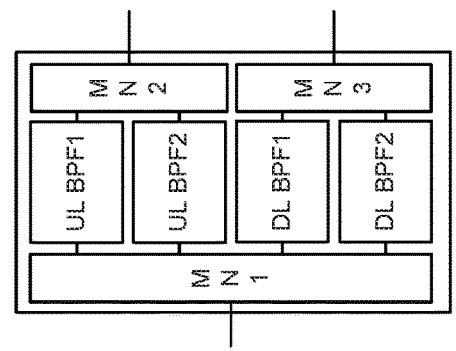
FIG. 17D
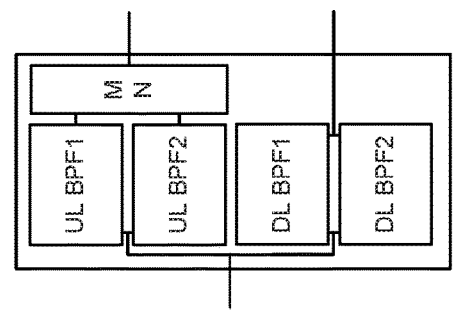
FIG. 17C
FIG. 17B

MULTI-COMMON PORT MULTIBAND FILTERS

RELATED APPLICATIONS

The present application is a continuation-in-part of U.S. patent application Ser. No. 15/291,763, filed Oct. 12, 2016, which claims to the benefit of U.S. Provisional Patent Application No. 62/241,279, filed Oct. 14, 2015, the entire specifications of which are hereby incorporated by reference in their entirety for all purposes.

BACKGROUND

Signal boosters and repeaters can be used to increase the quality of wireless communication between a wireless device and a wireless communication access point, such as a cell tower. Signal boosters can improve the quality of the wireless communication by amplifying, filtering, and/or applying other processing techniques to uplink and downlink signals communicated between the wireless device and the wireless communication access point.

As an example, the signal booster can receive, via an antenna, downlink signals from the wireless communication access point. The signal booster can amplify the downlink signal and then provide an amplified downlink signal to the wireless device. In other words, the signal booster can act as a relay between the wireless device and the wireless communication access point. As a result, the wireless device can receive a stronger signal from the wireless communication access point. Similarly, uplink signals from the wireless device (e.g., telephone calls and other data) can be directed to the signal booster. The signal booster can amplify the uplink signals before communicating, via an antenna, the uplink signals to the wireless communication access point.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein:

FIGS. 17A to 17D illustrate multi-filter packages in accordance with an example;

Figure 1:
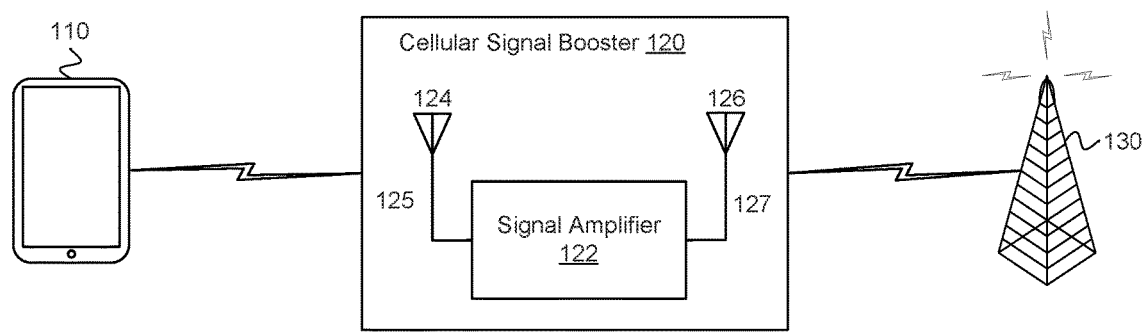
FIG. 1 illustrates a signal booster in communication with a wireless device and a base station in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

FIG. 1 illustrates an exemplary signal booster 120 in communication with a wireless device 110 and a base station 130. The signal booster 120 can be referred to as a repeater. A repeater can be an electronic device used to amplify (or boost) signals. The signal booster 120 (also referred to as a cellular signal amplifier) can improve the quality of wireless communication by amplifying, filtering, and/or applying other processing techniques via a signal amplifier 122 to uplink signals communicated from the wireless device 110 to the base station 130 and/or downlink signals communicated from the base station 130 to the wireless device 110. In other words, the signal booster 120 can amplify or boost uplink signals and/or downlink signals bi-directionally. In one example, the signal booster 120 can be at a fixed location, such as in a home or office. Alternatively, the signal booster 120 can be attached to a mobile object, such as a vehicle or a wireless device 110.

In one configuration, the signal booster 120 can include an integrated device antenna 124 (e.g., an inside antenna or a coupling antenna) and an integrated node antenna 126 (e.g., an outside antenna). The integrated node antenna 126 can receive the downlink signal from the base station 130. The downlink signal can be provided to the signal amplifier 122 via a second coaxial cable 127 or other type of radio frequency connection operable to communicate radio frequency signals. The signal amplifier 122 can include one or more cellular signal amplifiers for amplification and filtering. The downlink signal that has been amplified and filtered can be provided to the integrated device antenna 124 via a first coaxial cable 125 or other type of radio frequency connection operable to communicate radio frequency signals. The integrated device antenna 124 can wirelessly communicate the downlink signal that has been amplified and filtered to the wireless device 110.

Similarly, the integrated device antenna 124 can receive an uplink signal from the wireless device 110. The uplink signal can be provided to the signal amplifier 122 via the first coaxial cable 125 or other type of radio frequency connection operable to communicate radio frequency signals. The signal amplifier 122 can include one or more cellular signal amplifiers for amplification and filtering. The uplink signal that has been amplified and filtered can be provided to the integrated node antenna 126 via the second coaxial cable 127 or other type of radio frequency connection operable to communicate radio frequency signals. The integrated device antenna 124 can communicate the uplink signal that has been amplified and filtered to the base station 130.

In one example, the signal booster 120 can filter the uplink and downlink signals using any suitable analog or digital filtering technology including, but not limited to, surface acoustic wave (SAW) filters, bulk acoustic wave (BAW) filters, film bulk acoustic resonator (FBAR) filters, ceramic filters, waveguide filters or low-temperature co-fired ceramic (LTCC) filters.

In one example, the signal booster 120 can send uplink signals to a node and/or receive downlink signals from the node. The node can comprise a wireless wide area network (WWAN) access point (AP), a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or another type of WWAN access point.

In one configuration, the signal booster 120 used to amplify the uplink and/or a downlink signal is a handheld booster. The handheld booster can be implemented in a sleeve of the wireless device 110. The wireless device sleeve can be attached to the wireless device 110, but can be removed as needed. In this configuration, the signal booster 120 can automatically power down or cease amplification when the wireless device 110 approaches a particular base station. In other words, the signal booster 120 can determine to stop performing signal amplification when the quality of uplink and/or downlink signals is above a defined threshold based on a location of the wireless device 110 in relation to the base station 130.

In one example, the signal booster 120 can include a battery to provide power to various components, such as the signal amplifier 122, the integrated device antenna 124 and the integrated node antenna 126. The battery can also power the wireless device 110 (e.g., phone or tablet). Alternatively, the signal booster 120 can receive power from the wireless device 110.

In one configuration, the signal booster 120 can be a Federal Communications Commission (FCC)-compatible consumer signal booster. As a non-limiting example, the signal booster 120 can be compatible with FCC Part 20 or 47 Code of Federal Regulations (C.F.R.) Part 20.21 (Mar. 21, 2013). In addition, the signal booster 120 can operate on the frequencies used for the provision of subscriber-based services under parts 22 (Cellular), 24 (Broadband despondent PCS), 27 (AWS-1, 700 MHz Lower A-E Blocks, and 700 MHz Upper C Block), and 90 (Specialized Mobile Radio) of 47 C.F.R. The signal booster 120 can be configured to automatically self-monitor its operation to ensure compliance with applicable noise and gain limits. The signal booster 120 can either self-correct or shut down automatically if the signal booster's operations violate the regulations defined in FCC Part 20.21.

In one configuration, the signal booster 120 can improve the wireless connection between the wireless device 110 and the base station 130 (e.g., cell tower) or another type of wireless wide area network (WWAN) access point (AP). The signal booster 120 can boost signals for cellular standards, such as the Third Generation Partnership Project (3GPP) Long Term Evolution (LTE) Release 8, 9, 10, 11, 12, or 13 standards or Institute of Electronics and Electrical Engineers (IEEE) 802.16. In one configuration, the signal booster 120 can boost signals for 3GPP LTE Release 13.0.0 (March 2016) or other desired releases. The signal booster 120 can boost signals from the 3GPP Technical Specification 36.101 (Release 12 Jun. 2015) bands or LTE frequency bands. For example, the signal booster 120 can boost signals from the LTE frequency bands: 2, 4, 5, 12, 13, 17, and 25. In addition, the signal booster 120 can boost selected frequency bands based on the country or region in which the signal booster is used, including any of bands 1-70 or other bands, as disclosed in ETSI TS136 104 V13.5.0 (2016-10).

The number of LTE frequency bands and the level of signal improvement can vary based on a particular wireless device, cellular node, or location. Additional domestic and international frequencies can also be included to offer increased functionality. Selected models of the signal booster 120 can be configured to operate with selected frequency bands based on the location of use. In another example, the signal booster 120 can automatically sense from the wireless device 110 or base station 130 (or GPS, etc.) which frequencies are used, which can be a benefit for international travelers.

In one example, the integrated device antenna 124 and the integrated node antenna 126 can be comprised of a single antenna, an antenna array, or have a telescoping form-factor. In another example, the integrated device antenna 124 and the integrated node antenna 126 can be a microchip antenna. An example of a microchip antenna is AMMAL001. In yet another example, the integrated device antenna 124 and the integrated node antenna 126 can be a printed circuit board (PCB) antenna. An example of a PCB antenna is TE 2118310-1.

In one example, the integrated device antenna 124 can receive uplink (UL) signals from the wireless device 110 and transmit DL signals to the wireless device 110 using a single antenna. Alternatively, the integrated device antenna 124 can receive UL signals from the wireless device 110 using a dedicated UL antenna, and the integrated device antenna 124 can transmit DL signals to the wireless device 110 using a dedicated DL antenna.

In one example, the integrated device antenna 124 can communicate with the wireless device 110 using near field communication. Alternatively, the integrated device antenna 124 can communicate with the wireless device 110 using far field communication.

In one example, the integrated node antenna 126 can receive downlink (DL) signals from the base station 130 and transmit uplink (UL) signals to the base station 130 via a single antenna. Alternatively, the integrated node antenna 126 can receive DL signals from the base station 130 using a dedicated DL antenna, and the integrated node antenna 126 can transmit UL signals to the base station 130 using a dedicated UL antenna.

In one configuration, multiple signal boosters can be used to amplify UL and DL signals. For example, a first signal booster can be used to amplify UL signals and a second signal booster can be used to amplify DL signals. In addition, different signal boosters can be used to amplify different frequency ranges.

In one configuration, the signal booster 120 can be configured to identify when the wireless device 110 receives a relatively strong downlink signal. An example of a strong downlink signal can be a downlink signal with a signal strength greater than approximately −80 dBm. The signal booster 120 can be configured to automatically turn off selected features, such as amplification, to conserve battery life. When the signal booster 120 senses that the wireless device 110 is receiving a relatively weak downlink signal, the integrated booster can be configured to provide amplification of the downlink signal. An example of a weak downlink signal can be a downlink signal with a signal strength less than −80 dBm.

In one example, the signal booster 120 can also include one or more of: a waterproof casing, a shock absorbent casing, a flip-cover, a wallet, or extra memory storage for the wireless device. In one example, extra memory storage can be achieved with a direct connection between the signal booster 120 and the wireless device 110. In another example, Near-Field Communications (NFC), Bluetooth v4.0, Bluetooth Low Energy, Bluetooth v4.1, Bluetooth v4.2, Bluetooth 5, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, or IEEE 802.11ad can be used to couple the signal booster 120 with the wireless device 110 to enable data from the wireless device 110 to be communicated to and stored in the extra memory storage that is integrated in the signal booster 120. Alternatively, a connector can be used to connect the wireless device 110 to the extra memory storage.

In one example, the signal booster 120 can include photovoltaic cells or solar panels as a technique of charging the integrated battery and/or a battery of the wireless device 110. In another example, the signal booster 120 can be configured to communicate directly with other wireless devices with signal boosters. In one example, the integrated node antenna 126 can communicate over Very High Frequency (VHF) communications directly with integrated node antennas of other signal boosters. The signal booster 120 can be configured to communicate with the wireless device 110 through a direct connection, Near-Field Communications (NFC), Bluetooth v4.0, Bluetooth Low Energy, Bluetooth v4.1, Bluetooth v4.2, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, IEEE 802.11ad, a TV White Space Band (TVWS), or any other industrial, scientific and medical (ISM) radio band. Examples of such ISM bands include 2.4 GHz, 3.6 GHz, 4.9 GHz, 5 GHz, or 5.9 GHz. This configuration can allow data to pass at high rates between multiple wireless devices with signal boosters. This configuration can also allow users to send text messages, initiate phone calls, and engage in video communications between wireless devices with signal boosters. In one example, the integrated node antenna 126 can be configured to couple to the wireless device 110. In other words, communications between the integrated node antenna 126 and the wireless device 110 can bypass the integrated booster.

In another example, a separate VHF node antenna can be configured to communicate over VHF communications directly with separate VHF node antennas of other signal boosters. This configuration can allow the integrated node antenna 126 to be used for simultaneous cellular communications. The separate VHF node antenna can be configured to communicate with the wireless device 110 through a direct connection, Near-Field Communications (NFC), Bluetooth v4.0, Bluetooth Low Energy, Bluetooth v4.1, Bluetooth v4.2, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, IEEE 802.11ad, a TV White Space Band (TVWS), or any other industrial, scientific and medical (ISM) radio band.

In one configuration, the signal booster 120 can be configured for satellite communication. In one example, the integrated node antenna 126 can be configured to act as a satellite communication antenna. In another example, a separate node antenna can be used for satellite communications. The signal booster 120 can extend the range of coverage of the wireless device 110 configured for satellite communication. The integrated node antenna 126 can receive downlink signals from satellite communications for the wireless device 110. The signal booster 120 can filter and amplify the downlink signals from the satellite communication. In another example, during satellite communications, the wireless device 110 can be configured to couple to the signal booster 120 via a direct connection or an ISM radio band. Examples of such ISM bands include 2.4 GHz, 3.6 GHz, 4.9 GHz, 5 GHz, or 5.9 GHz.

Figure 2:
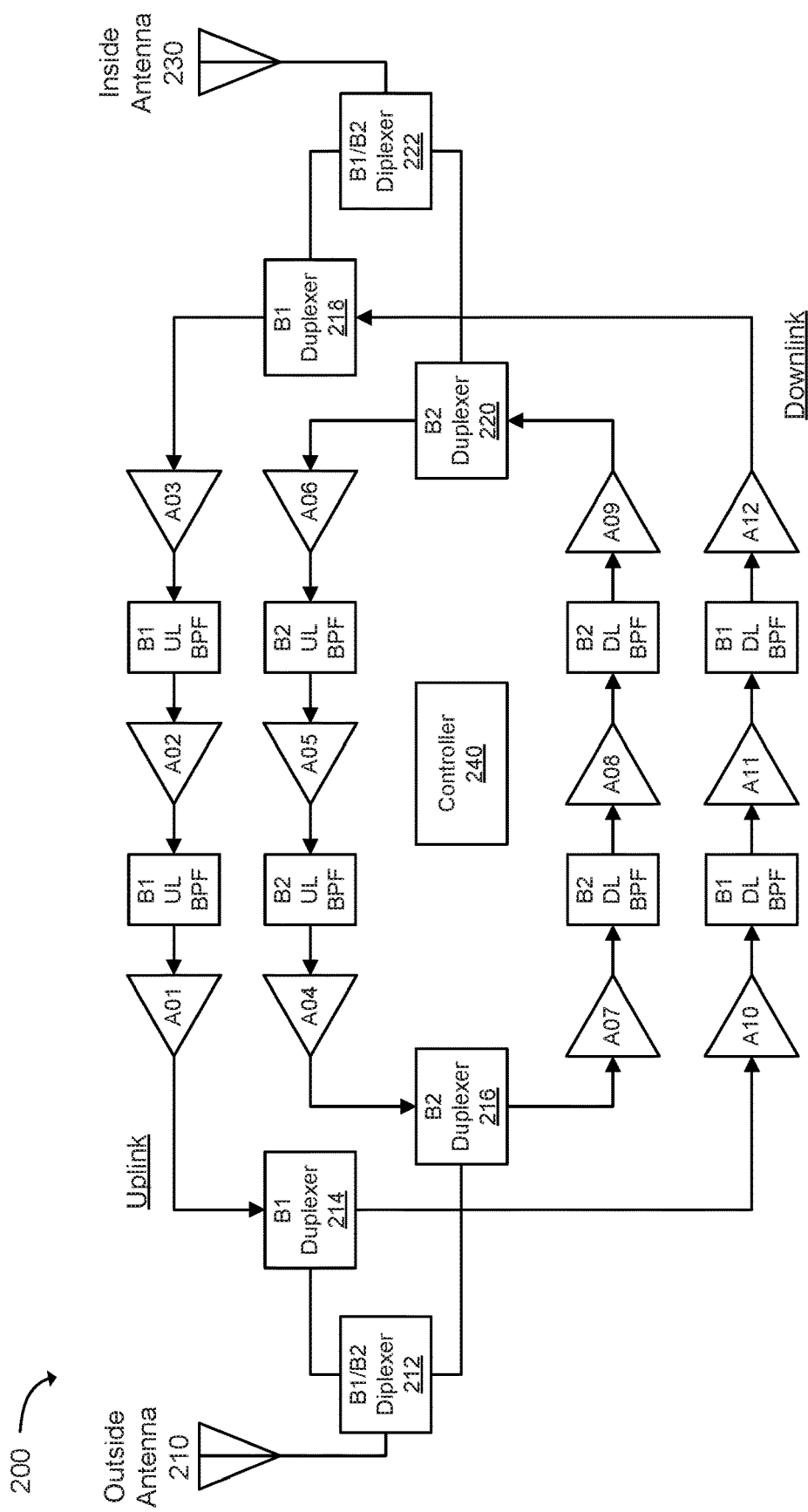
FIG. 2 illustrates a signal booster configured to amplify uplink (UL) and downlink (DL) signals using a separate signal path for each UL frequency band and DL frequency band in accordance with an example.

FIG. 2 illustrates an exemplary signal booster 200 configured to amplify uplink (UL) and downlink (DL) signals using a separate signal path for each UL frequency band and DL frequency band and a controller 240. An outside antenna 210, or an integrated node antenna, can receive a downlink signal. For example, the downlink signal can be received from a base station (not shown). The downlink signal can be provided to a first B1/B2 diplexer 212, wherein B1 represents a first frequency band and B2 represents a second frequency band. The first B1/B2 diplexer 212 can create a B1 downlink signal path and a B2 downlink signal path. Therefore, a downlink signal that is associated with B1 can travel along the B1 downlink signal path to a first B1 duplexer 214, or a downlink signal that is associated with B2 can travel along the B2 downlink signal path to a first B2 duplexer 216. After passing the first B1 duplexer 214, the downlink signal can travel through a series of amplifiers (e.g., A10, A11 and A12) and downlink band pass filters (BPF) to a second B1 duplexer 218. Alternatively, after passing the first B2 duplexer 216, the downlink can travel through a series of amplifiers (e.g., A07, A08 and A09) and downlink band pass filters (BFF) to a second B2 duplexer 220. At this point, the downlink signal (B1 or B2) has been amplified and filtered in accordance with the type of amplifiers and BPFs included in the signal booster 200. The downlink signals from the second B1 duplexer 218 or the second B2 duplexer 220, respectively, can be provided to a second B1/B2 diplexer 222. The second B1/B2 diplexer 222 can provide an amplified downlink signal to an inside antenna 230, or an integrated device antenna. The inside antenna 230 can communicate the amplified downlink signal to a wireless device (not shown), such as a mobile phone.

In one example, the inside antenna 230 can receive an uplink (UL) signal from the wireless device. The uplink signal can be provided to the second B1/B2 diplexer 222. The second B1/B2 diplexer 222 can create a B1 uplink signal path and a B2 uplink signal path. Therefore, an uplink signal that is associated with B1 can travel along the B1 uplink signal path to the second B1 duplexer 218, or an uplink signal that is associated with B2 can travel along the B2 uplink signal path to the second B2 duplexer 220. After passing the second B1 duplexer 218, the uplink signal can travel through a series of amplifiers (e.g., A01, A02 and A03) and uplink band pass filters (BPF) to the first B1 duplexer 214. Alternatively, after passing the second B2 duplexer 220, the uplink signal can travel through a series of amplifiers (e.g., A04, A05 and A06) and uplink band pass filters (BPF) to the first B2 duplexer 216. At this point, the uplink signal (B1 or B2) has been amplified and filtered in accordance with the type of amplifiers and BFFs included in the signal booster 200. The uplink signals from the first B1 duplexer 214 or the first B2 duplexer 216, respectively, can be provided to the first B1/B2 diplexer 212. The first B1/B2 diplexer 212 can provide an amplified uplink signal to the outside antenna 210. The outside antenna can communicate the amplified uplink signal to the base station.

In one example, the signal booster 200 can use the duplexers to separate the uplink and downlink frequency bands, which are then amplified and filtered separately. A multiple-band signal booster can typically have dedicated radio frequency (RF) amplifiers (gain blocks), RF detectors, variable RF attenuators and RF filters for each uplink and downlink band.

In one configuration, the cellular signal amplifier can be a 5-band booster. In other words, the cellular signal amplifier can perform amplification and filtering for downlink and uplink signals having a frequency in bands B1, B2, B3 B4 and/or B5. In this configuration, the cellular signal amplifier can have three uplink radio frequency (RF) amplifiers and three downlink RF amplifiers for each frequency band, which results in a total of 30 RF amplifiers for the five bands. However, placing 30 RF amplifiers on the cellular signal amplifier can become expensive, unwieldy and complex. In addition, the large number of parts can increase the likelihood for failure of one or more parts, thereby increasing repair and/or replacement costs of devices under warranty.

Figure 3:
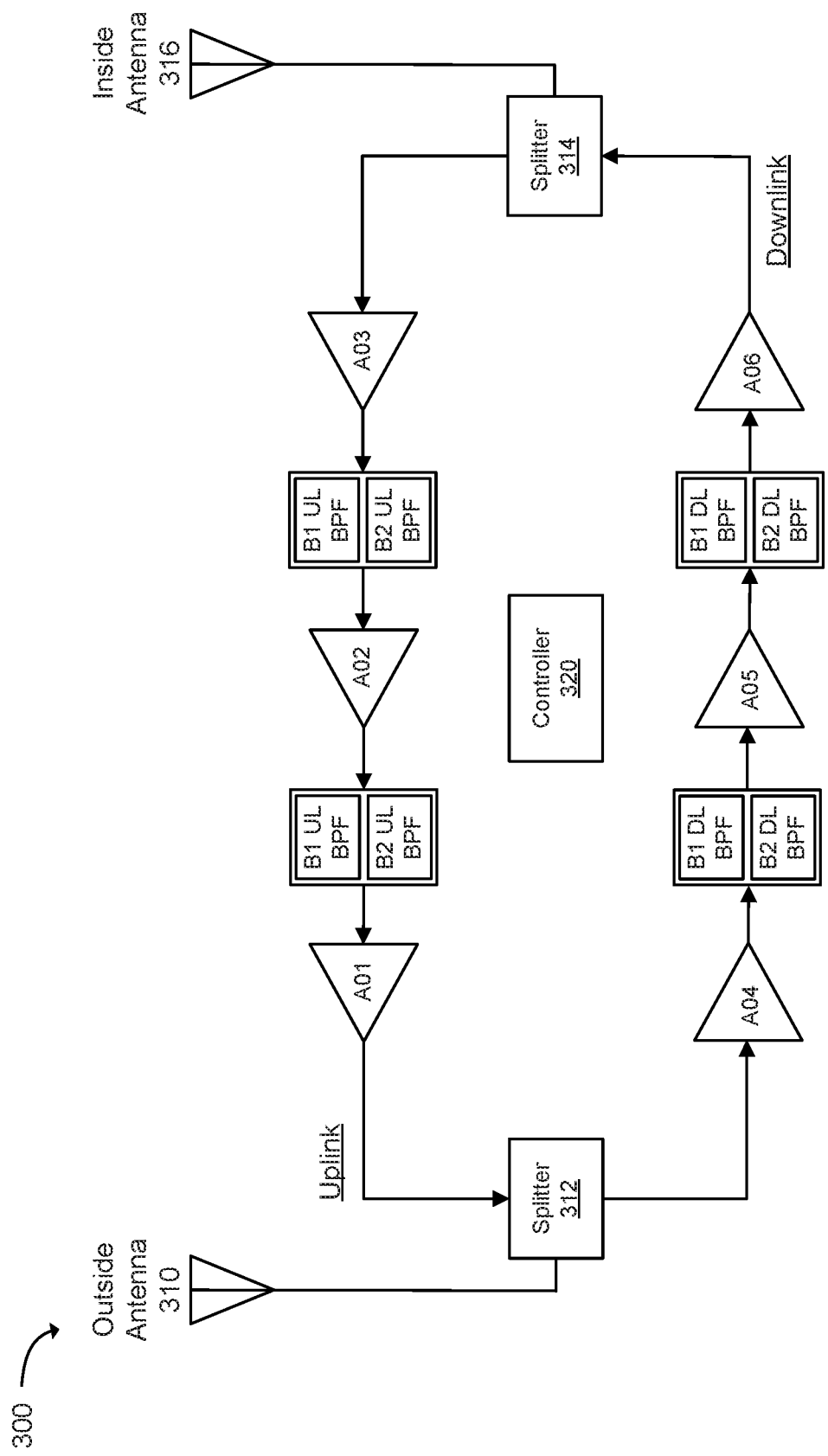
FIG. 3 illustrates a signal booster configured to amplify uplink (UL) and downlink (DL) signals using a combination of splitters and single-input, single-output (SISO) multiband filters in accordance with an example.

FIG. 3 illustrates an exemplary signal booster 300 configured to amplify uplink (UL) and downlink (DL) signals using a combination of splitters and single-input, single-output (SISO) multiband filters, as well as a controller 320. An outside antenna 310, or an integrated node antenna, can receive a downlink signal. For example, the downlink signal can be received from a base station (not shown). The downlink signal can be provided to a first splitter 312, and then onto a downlink signal path. The downlink signal can travel through a series of amplifiers (e.g., A04, A05 and A06) and DL SISO multiband filters. Each DL SISO multiband filter can include a first band pass filter for a first frequency represented by B1 and a second band pass filter for a second frequency represented by B2. The DL SISO multiband filter can comprise a plurality of filters located in a single package. Each filter in the single package can be designed and configured to operate with the other filters in the package. For example, each filter can be impedance matched with the other filters in the package to enable the filters to properly function within the same package. Each filter can be configured to provide a bandpass for a selected band that is non-frequency adjacent with the bandpass bands of other filters in the single package. The downlink signal that has been amplified and filtered may be provided to a second splitter 314, and then to an inside antenna 316, or an integrated device antenna. The inside antenna 316 can communicate an amplified downlink signal to a wireless device (not shown), such as a mobile phone.

In one configuration, the inside antenna 316 can receive an uplink signal from the wireless device. The uplink signal can be provided to the second splitter 314, and then onto an uplink signal path. The uplink signal can travel through a series of amplifiers (e.g., A01, A02 and A03) and UL SISO multiband filters. Each UL SISO multiband filter can include two or more filters in a single package to filter two or more bands. For example, a first band pass filter for a first frequency is represented by B1 and a second band pass filter for a second frequency is represented by B2. The uplink signal that has been amplified and filtered may be provided to the first splitter 312, and then to the outside antenna 310. The outside antenna 310 can communicate an amplified, filtered uplink signal to the base station.

In one example, the uplink bands and the downlink bands can be combined using the SISO multiband filters. Rather than using a separate UL amplifier and filter chain for each band, a single amplifier chain can be used with the SISO multiband filters capable of filtering the multiple bands. The splitters 312, 314 can separate the UL and DL signal paths, and then the SISO multiband filters can combine the uplink bands and the downlink bands. This line-sharing technique simplifies the architecture, the number of components and the layout of the signal booster 300. In addition, line-sharing due to the combined filters can allow for additional component sharing, such as RF amplifiers (gain blocks), RF attenuators, RF detectors, etc. With fewer components, the signal booster 300 can have an overall higher reliability and a lower cost.

In one configuration, the cellular signal amplifier can comprise a 5-band booster. In other words, the cellular signal amplifier can perform amplification and filtering for downlink and uplink signals having a frequency in B1, B2, B3 B4 and/or B5. In this configuration, the cellular signal amplifier can have three uplink radio frequency (RF) amplifiers and three downlink RF amplifiers. In other words, a total of 6 RF amplifiers can be used in the 5-band booster, in contrast to the 3 RF amplifiers that would be used per band in a traditional architecture (i.e. 30 amplifiers in a 5-band architecture), such as the architecture illustrated in FIG. 2.

Figure 4:
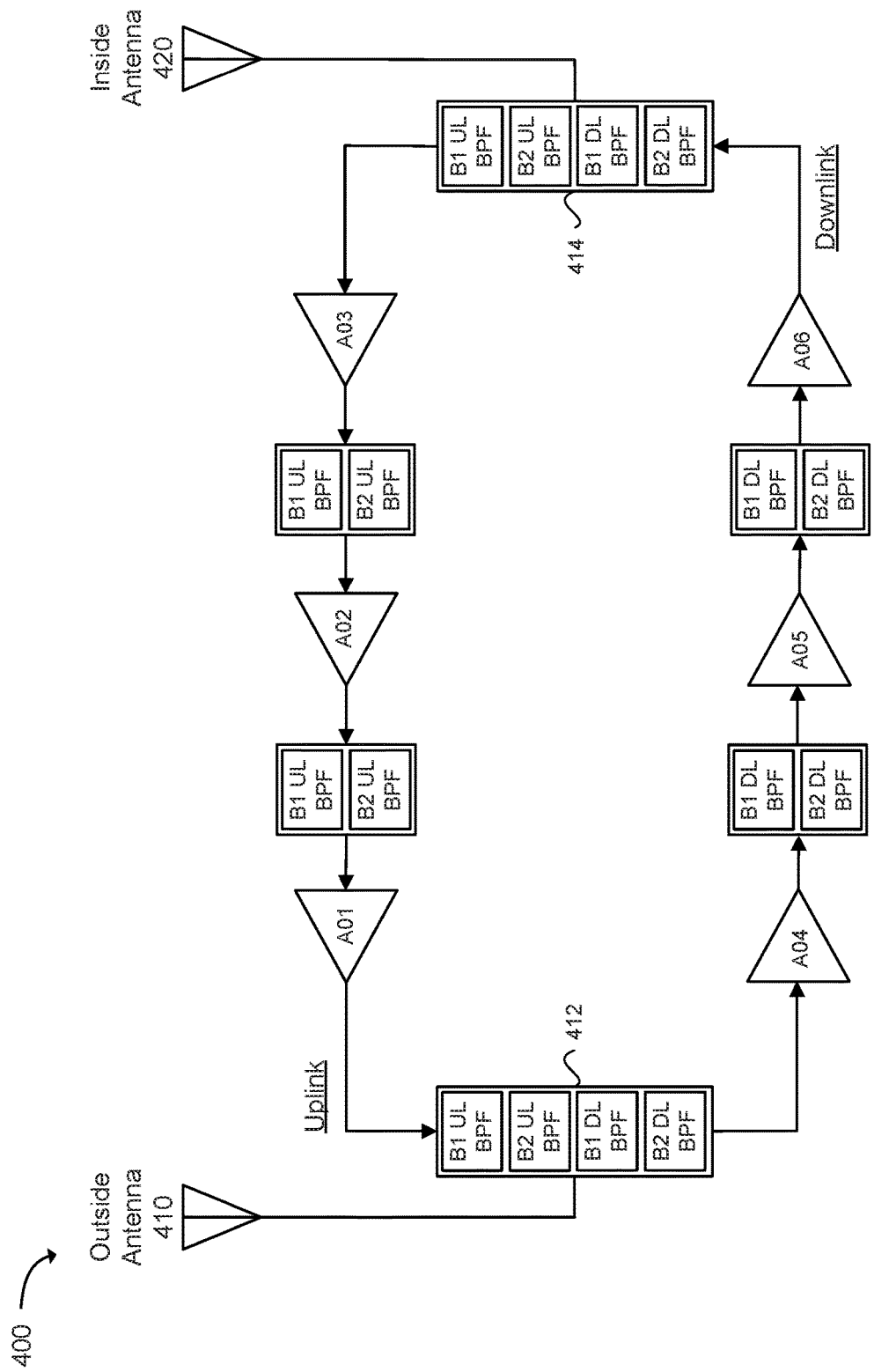
FIG. 4 illustrates a signal booster configured to amplify uplink (UL) and downlink (DL) signals using a combination of double-input, single-output (DISO) multiband filters and single-input, single-output (SISO) multiband filters in accordance with an example.

FIG. 4 illustrates an exemplary signal booster 400 configured to amplify uplink (UL) and downlink (DL) signals using multiple single-input, single-output (SISO) multiband filters and multiple double-input, single-output (DISO) multiband filters. An outside antenna 410, or an integrated node antenna, can receive a downlink signal. For example, the downlink signal can be received from a base station (not shown). The downlink signal can be provided to a first DISO multiband filter 412. The first DISO multiband filter 412 can include a B1 UL band pass filter, a B1 DL band pass filter, a B2 UL band pass filter and a B2 DL band pass filter. Since the signal from the outside antenna 410 is a downlink signal, the first DISO multiband filter 412 can filter the signal, such that the signal is conveyed onto a downlink signal path. In other words, if the downlink signal is a B1 DL signal and/or a B2 DL signal, the signal can be conveyed onto the downlink signal path. The downlink signal can travel through a series of amplifiers (e.g., A04, A05 and A06) and DL SISO multiband filters. Each DL SISO multiband filter can include a first band pass filter for a first frequency represented by B1 and a second band pass filter for a second frequency represented by B2. The downlink signal that has been amplified and filtered may be provided to a second DISO multiband filter 414, and then to an inside antenna 420, or an integrated device antenna. The inside antenna 420 can communicate an amplified downlink signal to a wireless device (not shown), such as a mobile phone.

In one configuration, the inside antenna 420 can receive an uplink signal. For example, the uplink signal can be received from the wireless device. The uplink signal can be provided to the second DISO multiband filter 414. The second DISO multiband filter 414 can include a B1 UL band pass filter, a B1 DL band pass filter, a B2 UL band pass filter and a B2 DL band pass filter. Since the signal from the inside antenna 420 is an uplink signal, the second DISO multiband filter 414 can filter the signal, such that the signal is conveyed onto an uplink signal path. In other words, if the signal is a B1 UL signal or a B2 UL signal, the signal can be conveyed onto the uplink signal path. The uplink signal can travel through a series of amplifiers (e.g., A01, A02 and A03) and UL SISO multiband filters. Each UL SISO multiband filter can include a first band pass filter for a first frequency represented by B1 and a second band pass filter for a second frequency represented by B2. The uplink signal that has been amplified and filtered may be provided to the first DISO multiband filter 412, and then to the outside antenna 410. The outside antenna 410 can communicate an amplified uplink signal to the base station.

In one example, the DISO multiband filters can be used to separate the UL and DL signal paths. The separation of the UL and DL signal paths using the DISO multiband filters can be more optimal than separating the UL and DL signal paths using splitters. In addition, the DISO multiband filters can be modified to have two outputs rather than four outputs, such that multiple filters can be combined into common ports. The combining can be achieved through impedance matching. For example, when using the DISO multiband filters, impedance matching can be used to combine the UL ports together and the DL ports together.

Figure 5:
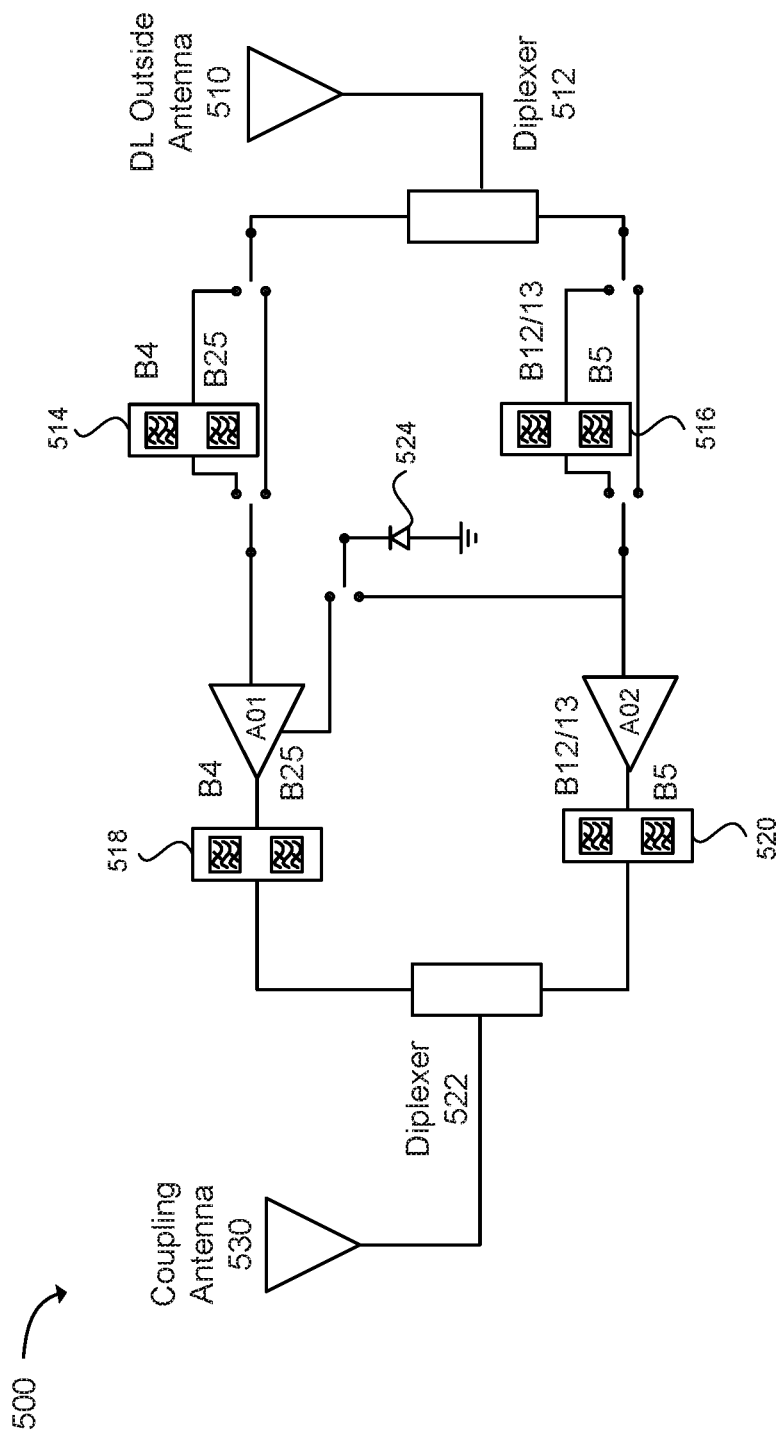
FIG. 5 illustrates a signal booster configured to amplify downlink (DL) signals in accordance with an example.

FIG. 5 illustrates an exemplary signal booster 500 configured to amplify downlink (DL) or uplink (UL) signals. A downlink (DL) outside antenna 510 can receive a DL signal from a base station (not shown). The DL signal can be provided to a first diplexer 512. The first diplexer 512 can appropriately direct the DL signal based on whether the DL signal is associated with a high frequency band or a low frequency band. Examples of high frequency bands include LTE frequency bands 4 and 25. Examples of low frequency bands include LTE frequency bands 5, 12, and 13. Therefore, a high band downlink signal can be directed towards a high frequency band downlink signal path, or a low band downlink signal can be directed towards a low frequency band downlink signal path. The high and low frequency bands can be separately filtered and amplified, and then combined using a second diplexer 522. Therefore, the downlink signal can be filtered and amplified when traveling through the high frequency band signal path or the low frequency band signal path.

More specifically, a high band DL signal can be provided to a first high band single-input single-output (SISO) multiband filter 514, a first amplifier (e.g., A01) and a second high band SISO multiband filter 518, wherein a high band downlink signal that has been filtered and amplified is provided to the second diplexer 522. Alternatively, a low band DL signal can be provided to a first low band single-input single-output (S ISO) multiband filter 516, a second amplifier (e.g., A02) and a second low band SISO multiband filter 520, wherein a low band downlink signal that has been filtered and amplified is provided to the second diplexer 522. As a non-limiting example, the amplification of the DL signals can be limited to a gain of less than or equal to 9 dB. The second diplexer 522 can receive the high band downlink signal or the low band downlink signal that has been amplified and filtered from the high frequency band signal path or the low frequency band signal path, respectively, and provide an amplified downlink signal to a coupling antenna 530. The coupling antenna 530 can transmit the amplified downlink signal to a wireless device (not shown), such as a cellular phone.

In one example, the signal booster 500 can include switchable front-end band pass filters 514, 516. The front-end band pass filters 514, 516 can be switched on when a weak DL signal is detected and switched off when a strong DL signal is detected. As a non-limiting example, a weak DL signal can have a signal strength that is less than −80 dBm, and a strong DL signal can have a signal strength that is greater than −80 dBm. Minimizing noise figure (NF) can be critical in weak signal areas. When the front-end band pass filters 514, 516 are switched off, the noise figure (NF) can be reduced.

In one example, the signal booster 500 can include a DL detector 524 (e.g., a diode) to detect DL signals received from the base station. When a DL signal is detected with a power greater than a selected threshold power level, then amplification of the DL signal can be turned off. When certain DL signals are greater than the selected threshold power level, a determination to not amplify the DL signals can result in reduced power usage.

Figure 6:
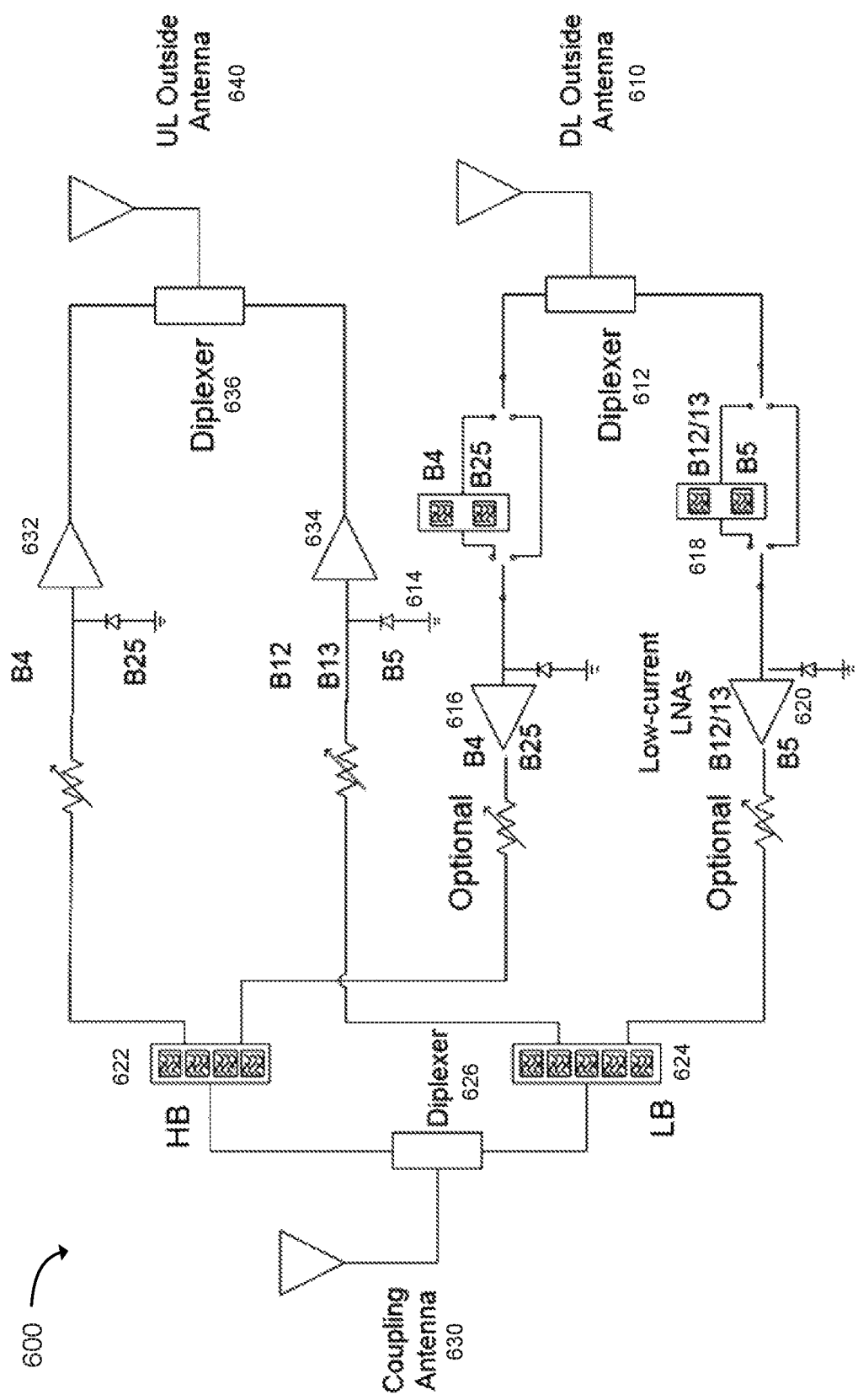
FIGS. 6-14 illustrate a signal booster configured to amplify uplink (UL) and downlink (DL) signals in accordance with an example.

FIG. 6 illustrates an exemplary signal booster 600 configured to amplify downlink (DL) signals and uplink (UL) signals. A downlink (DL) outside antenna 610 can receive a DL signal from a base station (not shown). The DL signal can be provided to a first diplexer 612. The first diplexer 612 can appropriately direct the DL signal based on whether the DL signal is associated with a high frequency band or a low frequency band. Examples of high frequency bands include LTE frequency bands 4 and 25. Examples of low frequency bands include LTE frequency bands 5, 12, and 13. Therefore, a high band downlink signal can be directed towards a high frequency band downlink signal path, or a low band downlink signal can be directed towards a low frequency band downlink signal path. Therefore, the high and low frequency bands can be separately filtered and amplified in the downlink signal paths.

More specifically, a high band DL signal can be provided to a first high band single-input single-output (SISO) multiband filter 614 and a first amplifier 616, wherein a high band downlink signal that has been filtered and amplified is provided to a first double-input single-output (DISO) multiband filter 622. Alternatively, a low band DL signal can be provided to a first low band single-input single-output (SISO) multiband filter 618 and a second amplifier 620, wherein a low band downlink signal that has been filtered and amplified is provided to a second DISO multiband filter 624. The downlink signal from the first DISO multiband filter 622 or the second DISO multiband filter 624 can be provided to a second diplexer 626. The second diplexer 626 can provide an amplified downlink signal to a coupling antenna 630. The coupling antenna can transmit the amplified downlink signal to a wireless device (not shown), such as a cellular phone.

In one configuration, the coupling antenna 630 can receive an uplink (UL) signal from the wireless device. The uplink signal can be provided to the second diplexer 626. The high and low frequency bands can be separately filtered and amplified in the uplink signal paths. For example, the second diplexer 626 can appropriately direct the UL signal based on whether the UL signal is associated with a high frequency band or a low frequency band. A high band UL signal can be directed to the first DISO multiband filter 622, or a low band UL signal can be directed to the second DISO multiband filter 624. The first DISO multiband filter 622 can direct the high band uplink signal to a third amplifier 632, and then the high band uplink signal that has been amplified can be received at a third diplexer 636. Alternatively, the second DISO multiband filter 624 can direct the low band uplink signal to a fourth amplifier 634, and then the low band uplink signal that has been amplified can be received at the third diplexer 636. The third amplifier 632 can provide an amplified uplink signal to an UL outside antenna 640. The UL outside antenna 640 can transmit the amplified uplink signal to the base station.

In one example, the signal booster 600 can utilize low noise amplifiers (LNAs) to amplify the DL signals and the UL signals. In past solutions, wireless devices can have higher noise figure (~5-6 dB) due to lack of low-noise amplifiers (LNAs) on the radio frequency (RF) front-end receiving paths. However, the signal booster 600 can lower the noise figure (to ~1-2 dB) by using one or more LNAs.

In one example, the signal booster 600 can include DL detectors (e.g., diodes) to detect DL signals received from the base station, as well as UL detectors (e.g., diodes) to detect UL signals received from the wireless device. When a DL signal is detected with a power greater than a selected threshold power level, then amplification of the DL signal can be turned off. Similarly, when an UL signal is detected with a power greater than a selected threshold power level, then amplification of the UL signal can be turned off. When certain DL and UL signals are greater than the selected threshold power level, a determination to not amplify the DL and UL signals can result in reduced power usage.

Figure 7:
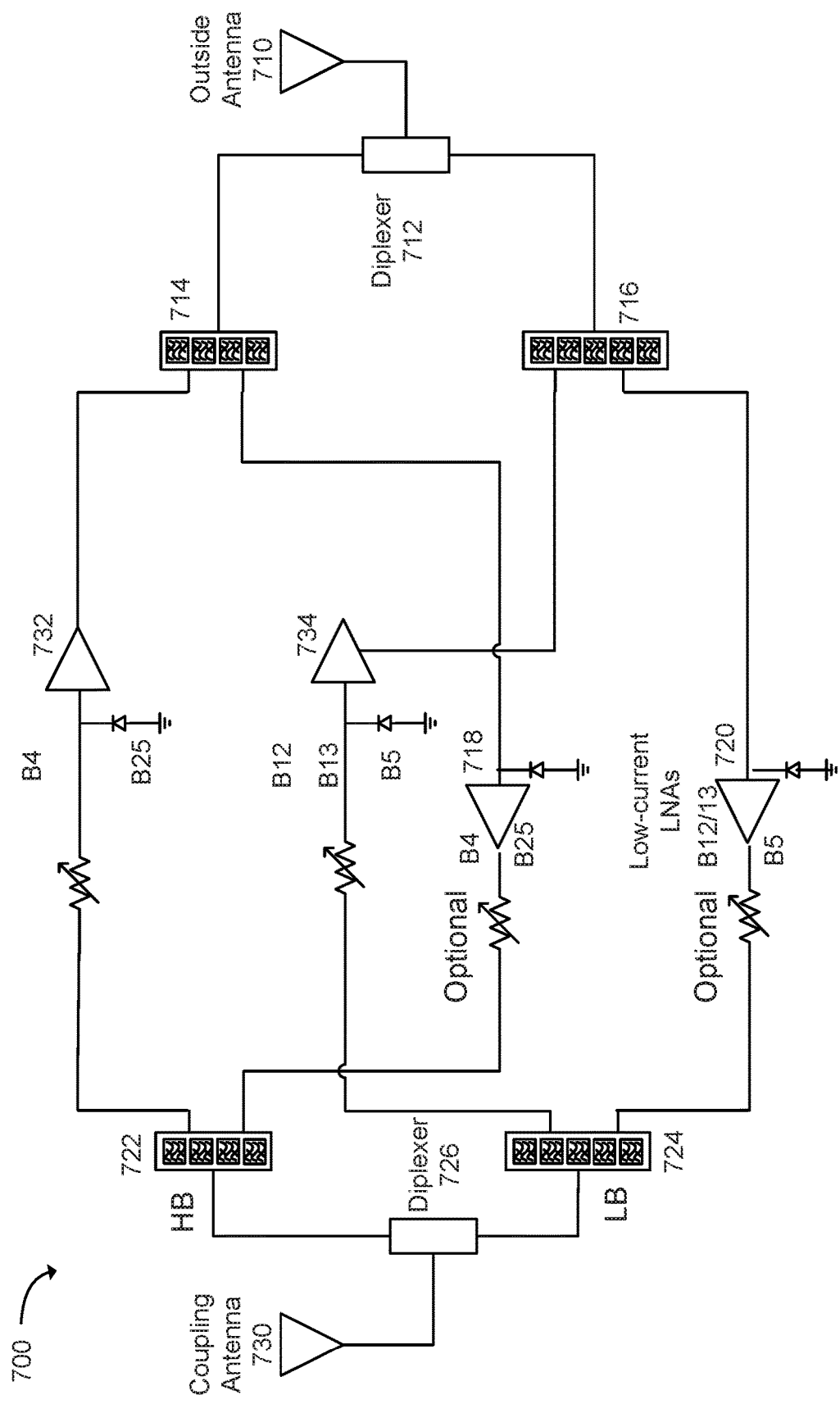

FIG. 7 illustrates an exemplary signal booster 700 configured to amplify downlink (DL) signals and uplink (UL) signals. A downlink (DL) outside antenna 710 can receive a DL signal from a base station (not shown). The DL signal can be provided to a first diplexer 712. The first diplexer 712 can appropriately direct the DL signal based on whether the DL signal is associated with a high frequency band or a low frequency band. Examples of high frequency bands include LTE frequency bands 4 and 25. Examples of low frequency bands include LTE frequency bands 5, 12, and 13. Therefore, a high band DL signal can be directed from the first diplexer 712 towards a first high band double-input single-output (DISO) multiband filter 714, or a low band DL signal can be directed from the first diplexer 712 towards a first low band DISO multiband filter 716. The first high band DISO multiband filter 714 can include a B4 DL band pass filter, a B25 DL band pass filter, a B4 UL band pass filter and a B25 UL band pass filter. The first low band DISO multiband filter 716 can include a B12/13 DL band pass filter, a B5 DL band pass filter, a B12 UL band pass filter, a B13 UL band pass filter and a B5 UL band pass filter.

In one example, the high band downlink signal can be directed from the first high band DISO multiband filter 714 to a first amplifier 718, and then to a second high band DISO multiband filter 722. Alternatively, the low band downlink signal can be directed from the first low band DISO multiband filter 716 to a second amplifier 720, and then to a second low band DISO multiband filter 724. A second diplexer 726 can receive an amplified downlink signal from the first high band DISO multiband filter 722 or the second low band DISO multiband filter 724, respectively, and then provide the amplified downlink signal to a coupling antenna 730 for transmission to a wireless device (not shown), such as a cellular phone.

In one configuration, the coupling antenna 730 can receive an uplink signal from the wireless device. The uplink signal can be provided to the second diplexer 726. In one example, the second diplexer 726 can appropriately direct the uplink signal, such that high and low frequency bands are separately filtered and amplified in the uplink signal paths. Therefore, a high band uplink signal can be directed from the second diplexer 726 towards the second high band DISO multiband filter 722, or a low uplink signal can be directed from the second diplexer 726 towards the second low band DISO multiband filter 724. In one example, the high uplink signal can be directed from the second high band DISO multiband filter 722 to a third amplifier 732, and then to the first high band DISO multiband filter 714. Alternatively, the low band uplink signal can be directed from the second low band DISO multiband filter 724 to a fourth amplifier 734, and then to the first low band DISO multiband filter 716. The first diplexer 712 can receive an amplified uplink signal from the first high band DISO multiband filter 714 or the first low band DISO multiband filter 716, respectively, and then provide the amplified uplink signal to the outside antenna 710 for transmission to the base station.

Figure 8:
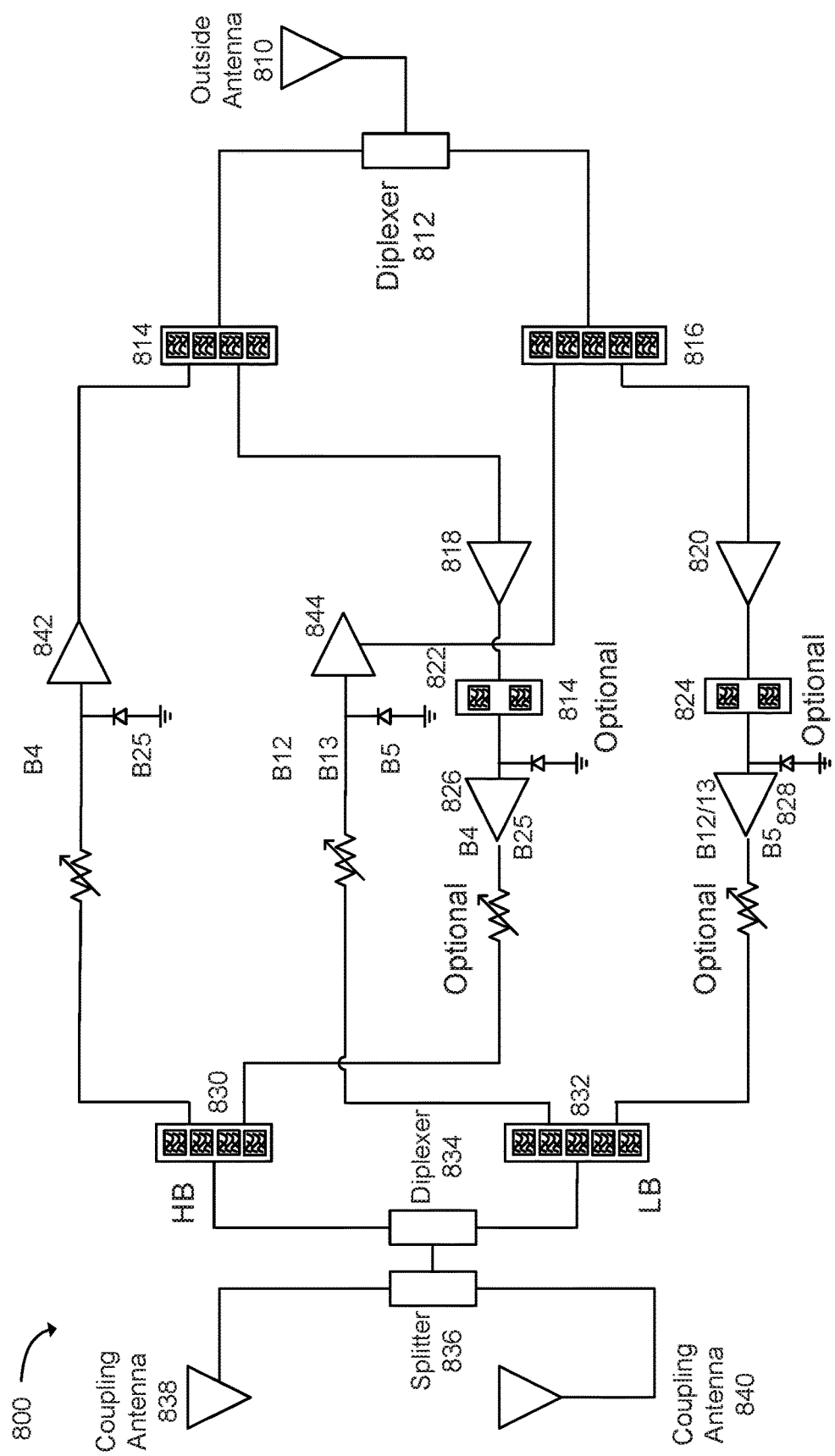

FIG. 8 illustrates an exemplary signal booster 800 configured to amplify downlink (DL) signals and uplink (UL) signals. A downlink (DL) outside antenna 810 can receive a DL signal from a base station (not shown). The DL signal can be provided to a first diplexer 812. The first diplexer 812 can appropriately direct the DL signal based on whether the DL signal is associated with a high frequency band or a low frequency band. Therefore, a high band DL signal can be directed from the first diplexer 812 towards a first high band double-input single-output (DISO) multiband filter 814, or a low band DL signal can be directed from the first diplexer 812 towards a first low band DISO multiband filter 816.

In one example, the high band downlink signal can be directed from the first high band DISO multiband filter 814 to a first amplifier 818, a first single-input single-output (SISO) multiband filter 822, and a second amplifier 826, and then to a second high band DISO multiband filter 830. Alternatively, the low band downlink signal can be directed from the first low band DISO multiband filter 816 to a third amplifier 820, a second SISO multiband filter 824, and a fourth amplifier 828, and then to a second low band DISO multiband filter 832. A second diplexer 834 can receive an amplified downlink signal from the first high band DISO multiband filter 830 or the second low band DISO multiband filter 832, respectively, and then provide the amplified downlink signal to a splitter 836 that is coupled to the second diplexer 834. The splitter 836 can split the amplified downlink signal, such that a high band downlink signal is provided from the splitter 836 to a first coupling antenna 838, or a low band downlink signal is provided from the splitter 836 to a second coupling antenna 840. The first coupling antenna 838 and the second coupling antenna 840 can transmit downlink signals to a wireless device (not shown), such as a cellular phone.

In one configuration, the first coupling antenna 838 and/or the second coupling antenna 840 can receive an uplink signal from the wireless device. The uplink signal can be provided to the splitter 836, and then the second diplexer 834. In one example, a high band uplink signal can be provided to the second high band DISO multiband filter 830, or a low band uplink signal can be provided to the second low band DISO multiband filter 832. The second high band DISO multiband filter 830 can provide the high band uplink signal to a fifth amplifier 842, and then to the first high band DISO multiband filter 814. Alternatively, the second low band DISO multiband filter 832 can provide the low band uplink signal to a sixth amplifier 844, and then to the first low band DISO multiband filter 816. The first diplexer 812 can receive an amplified uplink signal from the first high band DISO multiband filter 814 or the first low band DISO multiband filter 816, respectively. The first diplexer 812 can provide the amplified uplink signal to the outside antenna 810. The outside antenna can transmit an amplified uplink signal to the base station.

Figure 9:
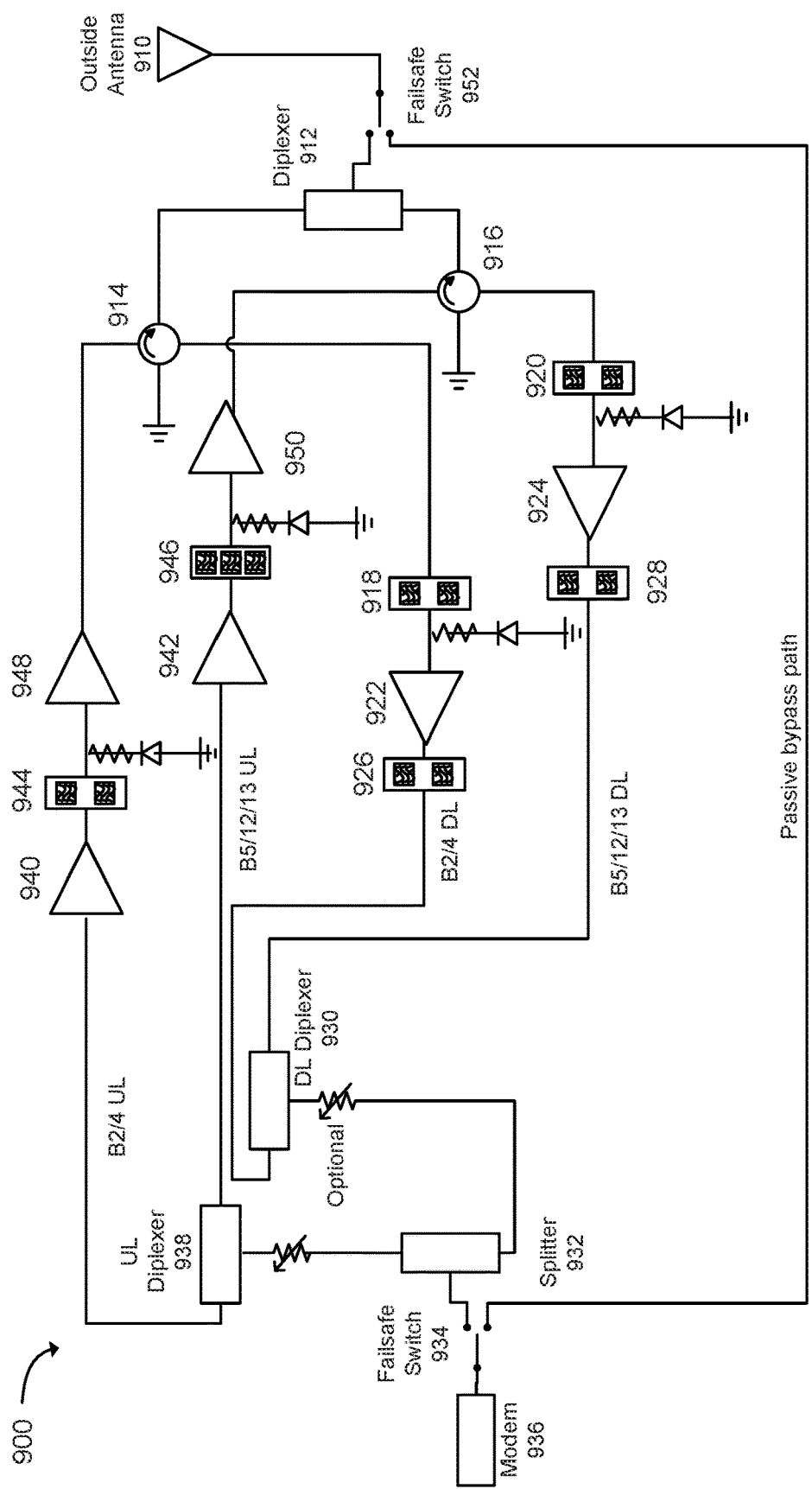

FIG. 9 illustrates an exemplary signal booster 900 configured to amplify downlink (DL) signals and uplink (UL) signals. A downlink (DL) outside antenna 910 can receive a DL signal from a base station (not shown). The DL signal can be provided to a first diplexer 912. The first diplexer 912 can appropriately direct the DL signal based on whether the DL signal is associated with a high frequency band or a low frequency band. For example, a high band DL signal can be directed towards a first circulator 914, or a low band DL signal can be directed towards a second circulator 916.

In one example, the high band downlink signal can be directed on a high band downlink signal path towards the first circulator 914. The high band downlink signal can be passed through a first single-input single-output (SISO) multiband filter 918, a first amplifier 922, and a second SISO multiband filter 926, and then towards a DL diplexer 930. Alternatively, the low band downlink signal can be directed on a low band downlink signal path towards the second circulator 916. The low band downlink signal can be passed through a third SISO multiband filter 920, a second amplifier 924, and a fourth SISO multiband filter 928, and then towards the DL diplexer 930. The DL diplexer 930 can direct an amplified downlink signal received from the high band downlink signal path or the low band downlink signal path, respectively, to a splitter 932. The amplified downlink signal can be transmitted from the splitter 932 to a modem 936 (or inside antenna) for transmission to a wireless device (not shown), such as the cellular phone.

In one configuration, the modem 936 (or inside antenna) can receive an uplink signal from the wireless device. The uplink signal can be provided to the splitter 932, and then the uplink signal can be provided to an UL diplexer 938. The UL diplexer 938 can appropriately direct the UL signal based on whether the UL signal is associated with a high frequency band or a low frequency band. For example, the UL diplexer 938 can direct a high band uplink signal along a high band uplink signal path, or the UL diplexer 938 can direct a low band uplink signal along a low band uplink signal path. In one example, the high band uplink signal can be passed through a third amplifier 940, a fifth SISO multiband filter 944, and a fourth amplifier 948, and then towards the first circulator 914. The first circulator 914 can direct the high band uplink signal to the first diplexer 912. Alternatively, the low band uplink signal can be passed through a fifth amplifier 942, a sixth SISO multiband filter 946, and a sixth amplifier 950, and then towards the second circulator 916. The second circulator 916 can direct the low band uplink signal to the first diplexer 912. The first diplexer 912 can receive an amplified uplink signal from the first circulator 914 or the second circulator 916, respectively, and then can provide the amplified uplink signal to the outside antenna 910 for transmission to the base station.

In one configuration, the signal booster 900 can include a first failsafe switch 952 coupled to the outside antenna 910, and a second failsafe switch 934 coupled to the modem 936. Based on whether the first failsafe switch 952 and the second failsafe switch 934 are opened or closed, uplink signals received at the outside antenna 910 can be directly provided to the modem 936 along a passive bypass path, thereby bypassing the uplink amplification and filtering stages of the signal booster 900. Similarly, downlink signals received at the modem 936 can be directly provided to the outside antenna 910 along the passive bypass path, thereby bypassing the uplink amplification and filtering stages of the signal booster 900.

Figure 10:
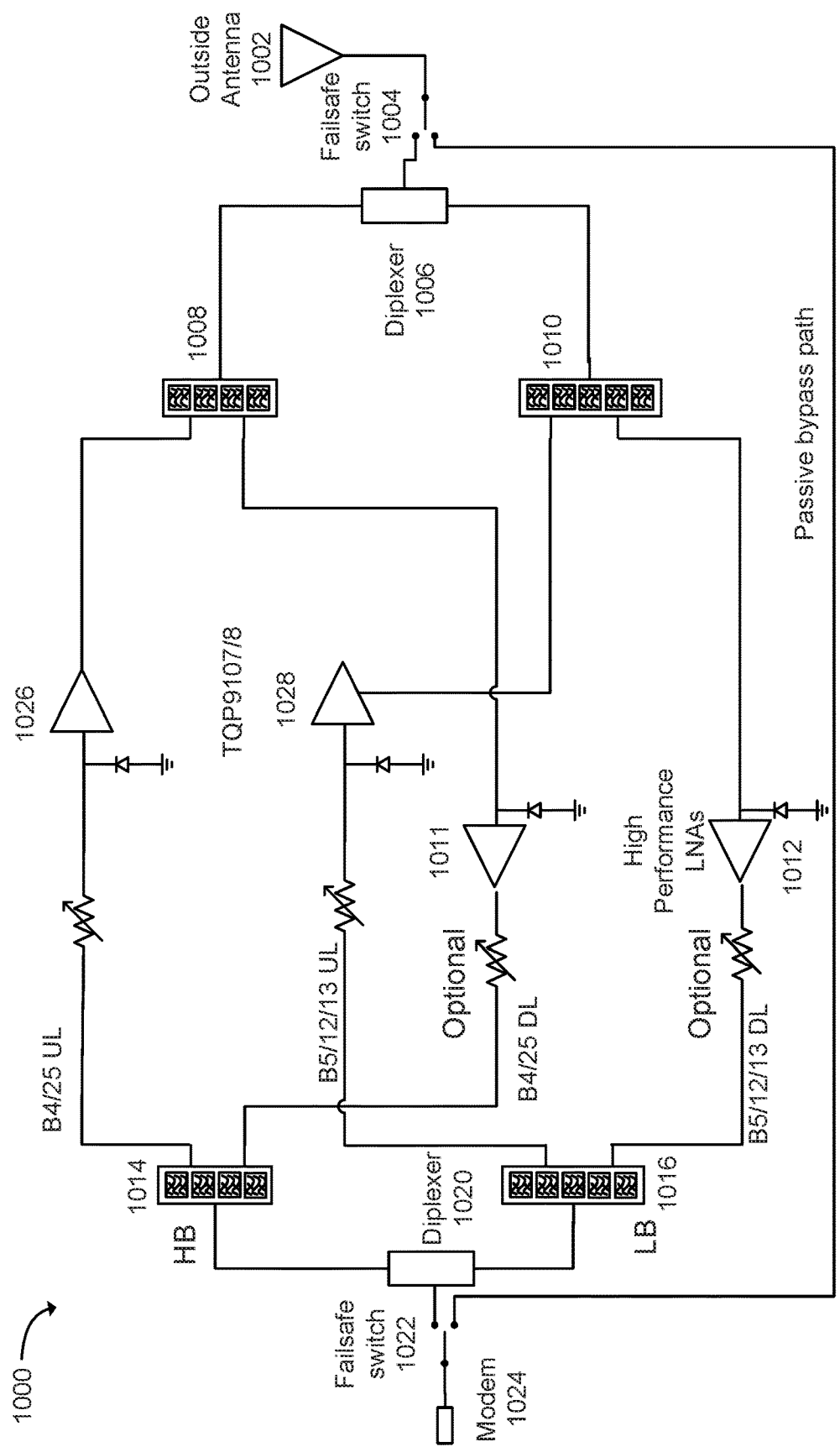

FIG. 10 illustrates an exemplary signal booster 1000 configured to amplify downlink (DL) signals and uplink (UL) signals. A downlink (DL) outside antenna 1002 can receive a DL signal from a base station (not shown). The DL signal can be provided to a first diplexer 1006. The first diplexer 1006 can direct the appropriately direct the DL signal based on whether the DL signal is associated with a high frequency band or a low frequency band. Therefore, a high band DL signal can be directed from the first diplexer 1006 towards a first high band double-input single-output (DISO) multiband filter 1008, or a low band DL signal can be directed from the first diplexer 1006 towards a first low band DISO multiband filter 1010. In one example, the high band DL signal can be directed from the first high band DISO multiband filter 1008 to a first amplifier 1011, and then to a second high band DISO multiband filter 1014. Alternatively, the low band DL signal can be directed from the first low band DISO multiband filter 1010 to a second amplifier 1012, and then to a second low band DISO multiband filter 1016. A second diplexer 1020 can receive an amplified downlink signal from the second high band DISO multiband filter 1014 or the second low band DISO multiband filter 1016, respectively, and then send the amplified downlink signal to a modem 1024 for transmission to a wireless device (not shown), such as a cellular phone.

In one configuration, the modem 1024 can receive an uplink signal from the wireless device. The uplink signal can be provided to the second diplexer 1020. The second diplexer 1020 can appropriately direct the UL signal based on whether the UL signal is associated with a high frequency band or a low frequency band. Therefore, a high band uplink signal can be directed from the second diplexer 1020 towards the second high band DISO multiband filter 1014, or a low band uplink signal can be directed from the second diplexer 1020 towards the second low band DISO multiband filter 1016. In one example, the high band uplink signal can be directed from the second high band DISO multiband filter 1014 to a third amplifier 1026, and then to the first high band DISO multiband filter 1008. Alternatively, the low band uplink signal can be directed from the second low band DISO multiband filter 1016 to a fourth amplifier 1028, and then to the first low band DISO multiband filter 1010. The first diplexer 1006 can receive an amplified uplink signal from the first high band DISO multiband filter 1008 or the first low band DISO multiband filter 1010, respectively, and then send the amplified uplink signal to the outside antenna 1002 for transmission to a base station.

In one configuration, the signal booster 1000 can include a first failsafe switch 1004 coupled to the outside antenna 1002, and a second failsafe switch 1022 coupled to the modem 1024. Based on whether the first failsafe switch 1004 and the second failsafe switch 1022 are opened or closed, downlink signals received at the outside antenna 1002 can be directly provided to the modem 1024 along a passive bypass path, thereby bypassing the downlink amplification and filtering stages of the signal booster 1000. Similarly, uplink signals received at the modem 1024 can be directly provided to the outside antenna 1002 along the passive bypass path, thereby bypassing the uplink amplification and filtering stages of the signal booster 1000.

Figure 11:
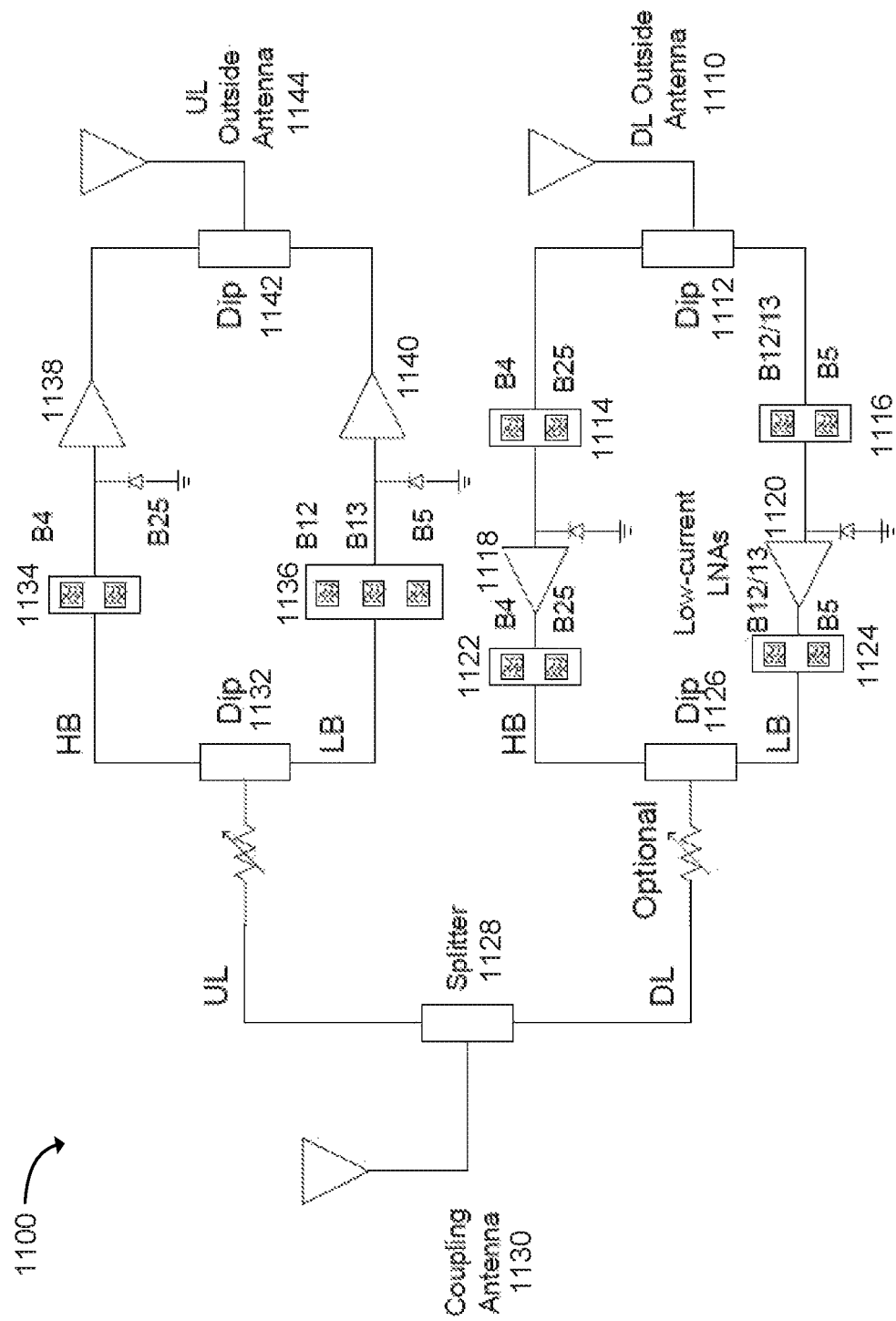

FIG. 11 illustrates an exemplary signal booster 1100 configured to amplify downlink (DL) signals and uplink (UL) signals. A downlink (DL) outside antenna 1110 can receive a DL signal from a base station (not shown). The DL signal can be provided to a first diplexer 1112. The first diplexer 1112 can appropriately direct the DL signal based on whether the DL signal is associated with a high frequency band or a low frequency band. Therefore, a high band DL signal can be provided to a first high band single-input single-output (S ISO) multiband filter 1114, a first amplifier 1118, and a second high band SISO filter 1122, and then towards a second diplexer 1126. Alternatively, a low band DL signal can be provided to a first low band SISO multiband filter 1116, a second amplifier 1120, and a second low band SISO filter 1124, and then towards the second diplexer 1126. The second diplexer 1126 can receive an amplified downlink signal from the second high band SISO filter 1122 or the second low band SISO filter 1124, respectively, and then send the amplified downlink signal to a splitter 1128. The splitter 1128 can pass the amplified downlink signal to a coupling antenna 1130 for transmission to a wireless device (not shown).

In one configuration, the coupling antenna 1130 can receive an uplink signal from the wireless device. The uplink signal can be provided to the splitter 1128, and then the uplink signal can be provided to a third diplexer 1132. The third diplexer 1132 can appropriately direct the UL signal based on whether the UL signal is associated with a high frequency band or a low frequency band. Therefore, a high band UL signal can be provided to a fifth high band SISO multiband filter 1134, a third amplifier 1138, and then towards a fourth diplexer 1142. Alternatively, a low band UL signal can be provided to a sixth SISO multiband filter 1136, a fourth amplifier 1140, and then towards the fourth diplexer 1142. The fourth diplexer 1142 can receive an amplified downlink signal from the third amplifier 1138 or the fourth amplifier 1140, respectively, and then send the amplified uplink signal to an UL outside antenna 1144 for transmission to the base station.

Figure 12:
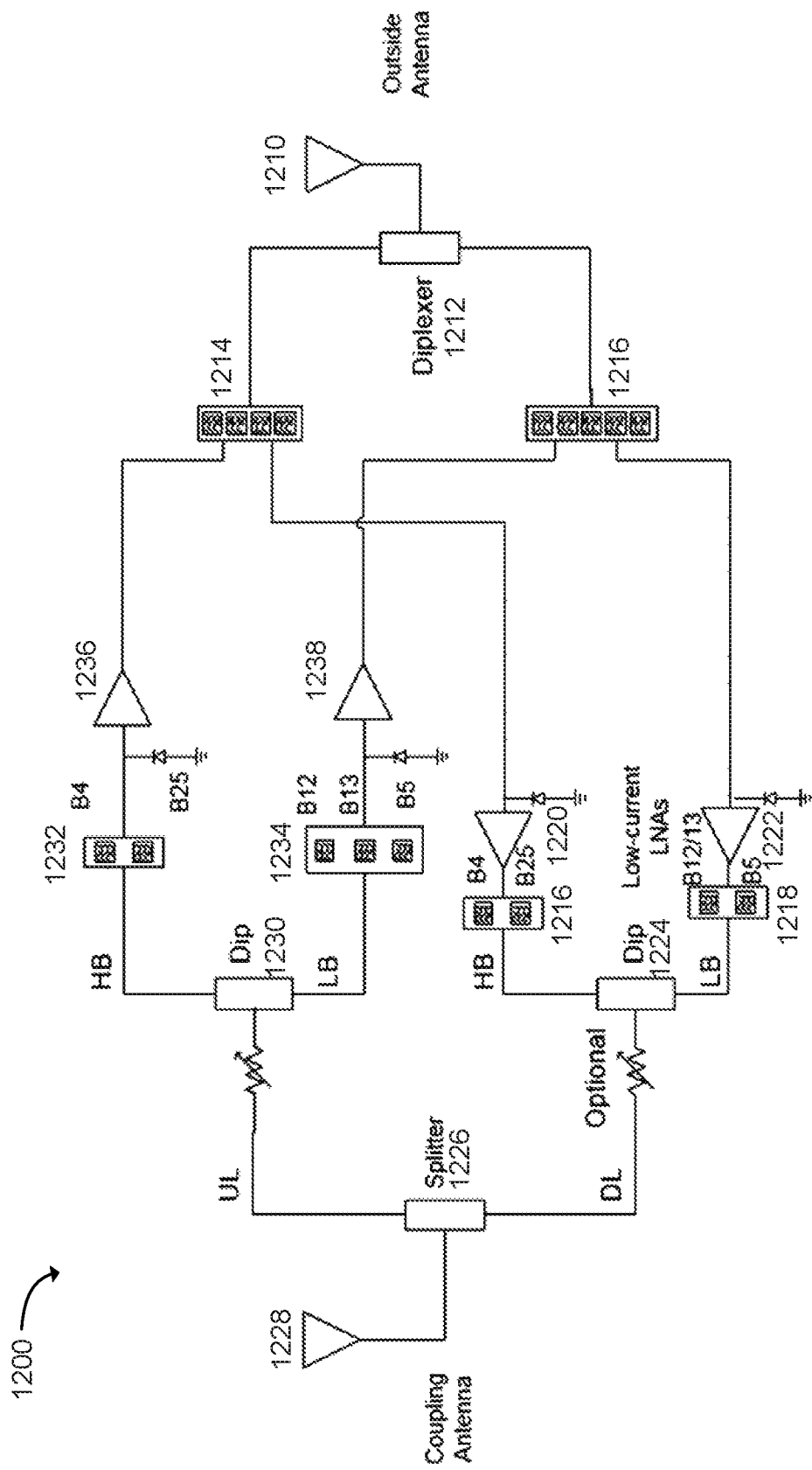

FIG. 12 illustrates an exemplary signal booster 1200 configured to amplify downlink (DL) signals and uplink (UL) signals. A downlink (DL) outside antenna 1210 can receive a DL signal from a base station (not shown). The DL signal can be provided to a first diplexer 1212. The first diplexer 1212 can appropriately direct the DL signal based on whether the DL signal is associated with a high frequency band or a low frequency band. Therefore, a high band DL signal can be directed from the first diplexer 1212 towards a high band double-input single-output (DISO) multiband filter 1214, or a low band DL signal can be directed from the first diplexer 1212 towards a low band DISO multiband filter 1216. In one example, the high band DL signal can be directed from the high band DISO multiband filter 1214 to a first amplifier 1220, a first single-input single-output (SISO) multiband filter 1216, and then to a second diplexer 1224. Alternatively, the low band DL signal can be directed from the low band DISO multiband filter 1216 to a second amplifier 1222, a second SISO multiband filter 1218, and then to the second diplexer 1224. The second diplexer 1224 can receive an amplified downlink signal from the first SISO multiband filter 1216 or the second SISO multiband filter 1218, respectively, and then send the amplified downlink signal to a splitter 1226, and then to a coupling antenna 1228 for transmission to a wireless device (not shown), such as a cellular phone.

In one configuration, the coupling antenna 1228 can receive an uplink signal from the wireless device. The uplink signal can be provided to the splitter 1226, and then the uplink signal can be provided to a third diplexer 1230. The third diplexer 1230 can appropriately direct the UL signal based on whether the UL signal is associated with a high frequency band or a low frequency band. Therefore, a high band UL signal can be directed from the third diplexer 1230 towards a third SISO multiband filter 1232, a third amplifier 1236, and then to the high band DISO multiband filter 1214. Alternatively, a low band UL signal can be directed from the third diplexer 1230 towards a fourth SISO multiband filter 1234, a fourth amplifier 1238, and then to the low band DISO multiband filter 1216. The first diplexer 1212 can receive an amplified uplink signal from the high band DISO multiband filter 1214 or the low band DISO multiband filter 1216, respectively, and then the amplified uplink signal can be provided to the outside antenna 1210 for transmission to the base station.

Figure 13:
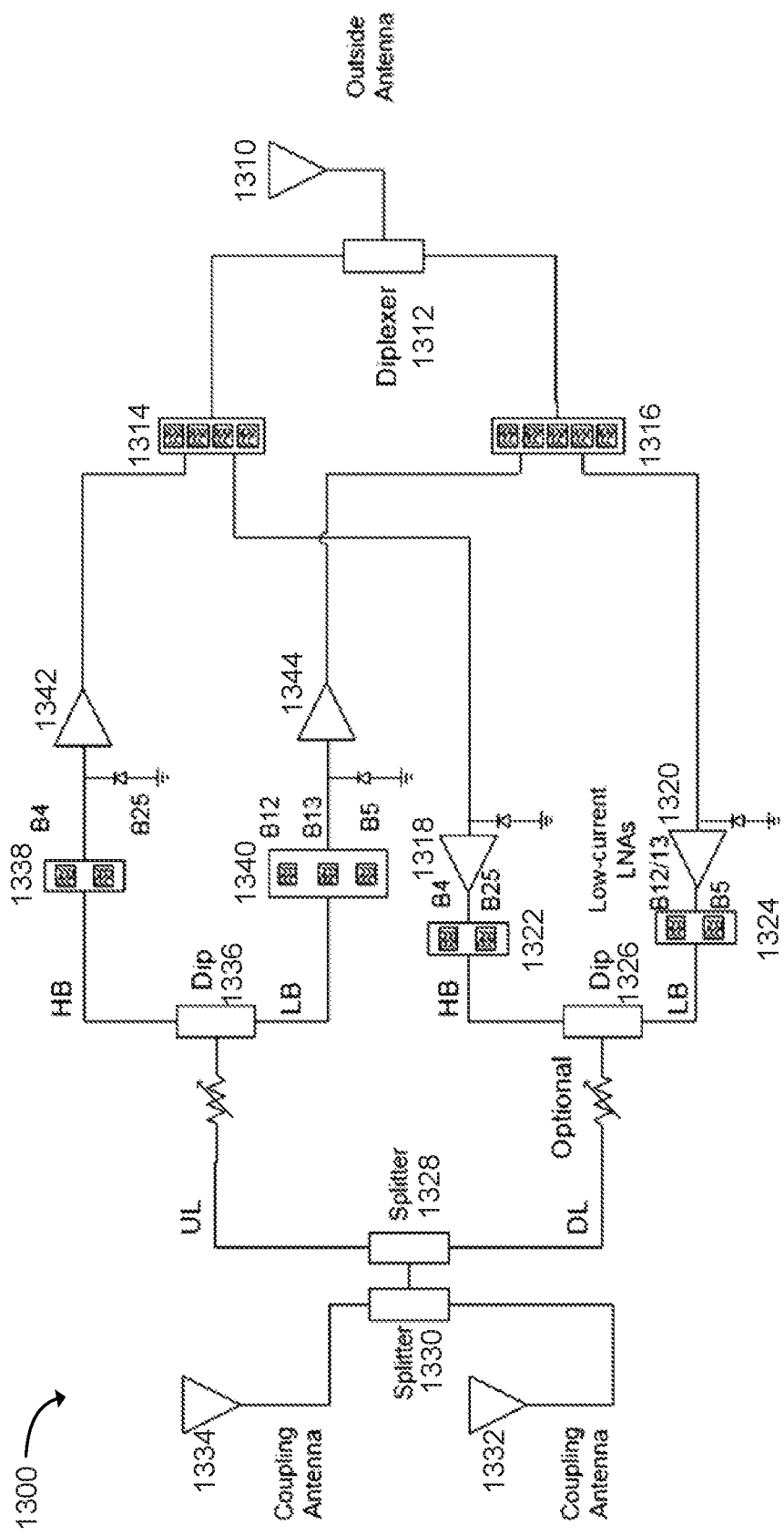

FIG. 13 illustrates an exemplary signal booster 1300 configured to amplify downlink (DL) signals and uplink (UL) signals. A downlink (DL) outside antenna 1310 can receive a DL signal from a base station (not shown). The DL signal can be provided to a first diplexer 1312. The first diplexer 1312 can appropriately direct the DL signal based on whether the DL signal is associated with a high frequency band or a low frequency band. Therefore, a high band DL signal can be directed from the first diplexer 1312 towards a high band double-input single-output (DISO) multiband filter 1314, or a low band DL signal can be directed from the first diplexer 1312 towards a low band DISO multiband filter 1316. In one example, the high band DL signal can be directed from the high band DISO multiband filter 1314 to a first amplifier 1318, a first single-input single-output (SISO) multiband filter 1322, and then to a second diplexer 1326. Alternatively, the low band DL signal can be directed from the low band DISO multiband filter 1316 to a second amplifier 1320, a second SISO multiband filter 1324, and then to the second diplexer 1326. The second diplexer 1326 can receive an amplified downlink signal from the first SISO multiband filter 1322 or the second SISO multiband filter 1324, respectively, and then send the amplified downlink signal to a first splitter 1328, which can be coupled to a second splitter 1330. The second splitter 1330 can split the amplified downlink signal, such that a high band downlink signal is provided from the splitter 1330 to a first coupling antenna 1334, and a low band downlink signal is provided from the splitter 1330 to a second coupling antenna 1332. The first coupling antenna 1334 and the second coupling antenna 1332 can transmit downlink signals to a wireless device (not shown), such as a cellular phone.

In one configuration, the first coupling antenna 1334 and/or the second coupling antenna 1332 can receive an uplink signal from the wireless device. The uplink signal can be provided to the second splitter 1330, and then to the first splitter 1328. The first splitter 1328 can provide the uplink signal to a third diplexer 1336. The third diplexer 1336 can appropriately direct the UL signal based on whether the UL signal is associated with a high frequency band or a low frequency band. Therefore, a high band UL signal can be directed from the third diplexer 1336 towards a third SISO multiband filter 1338, a third amplifier 1342, and then to the high band DISO multiband filter 1314. Alternatively, a low band UL signal can be directed from the third diplexer 1336 towards a fourth SISO multiband filter 1340, a fourth amplifier 1344, and then to the low band DISO multiband filter 1316. The first diplexer 1312 can receive an amplified uplink signal from the high band DISO multiband filter 1314 or the low band DISO multiband filter 1316, respectively, and then provide the amplified uplink signal to the outside antenna 1310 for transmission to the base station.

Figure 14:
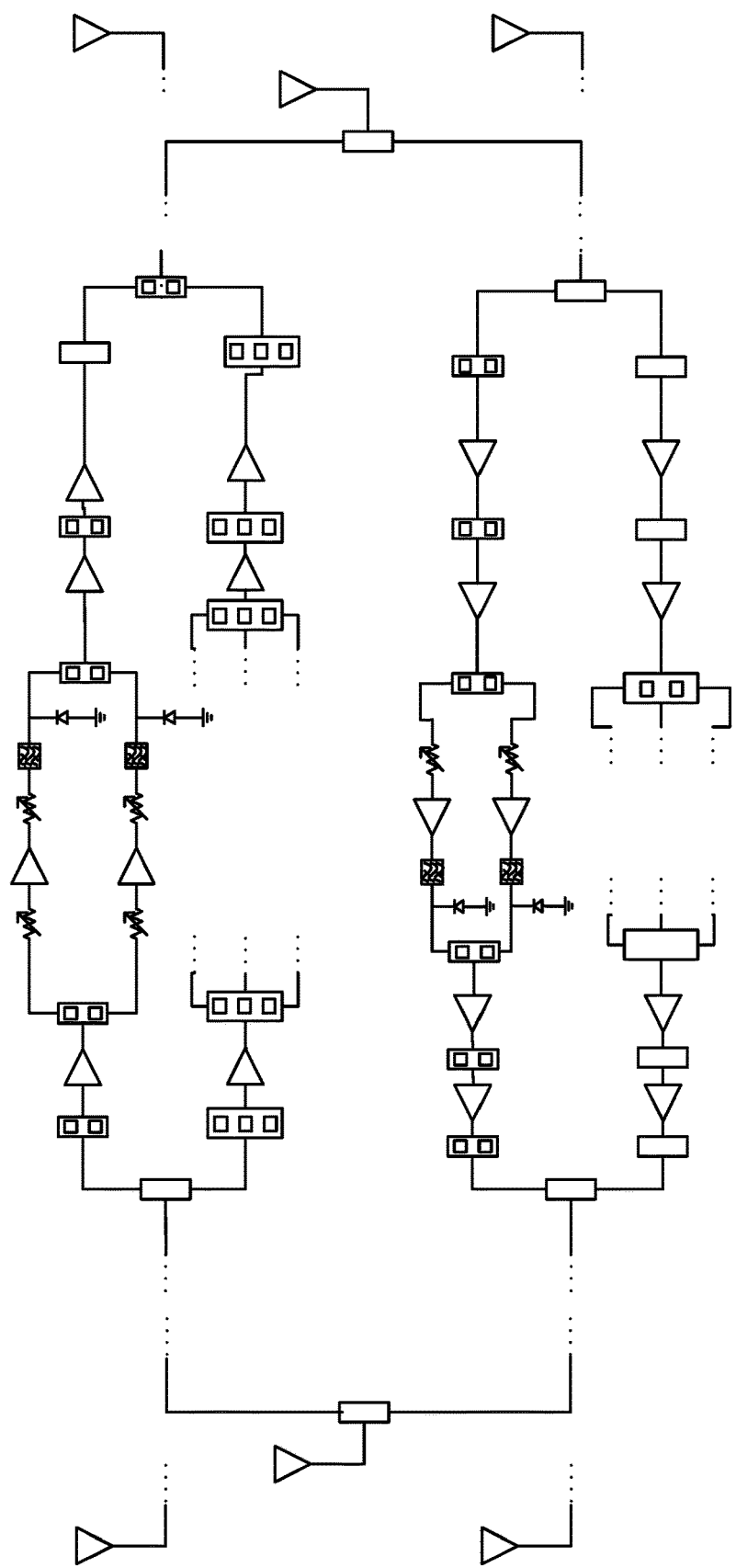

FIG. 14 illustrates an exemplary signal booster configured to amplify downlink (DL) signals and uplink (UL) signals.

The signal booster can include a series of outside antennas and a series of coupling antennas. The outside antennas can receive downlink signals from a base station, as well as transmit uplink signals to the base station. The coupling antennas can receive uplink signals from a wireless device, as well as transmit downlink signals to the wireless device. The signal booster can use a plurality of diplexers, duplexers, circulators, etc. when amplifying the downlink and uplink signals. In addition, the signal booster can include a plurality of single-input single-output (SISO) multiband filters, double-input, single-output (DISO) multiband filters, amplifiers, etc. when amplifying the downlink and uplink signals.

In one configuration, two or more BPFs can be stacked together or connected to form a multi-filter package (e.g., a SISO filter package). The multi-filter package can also be referred to as a dual-common port multi-bandpass filter. The dual-common port multi-bandpass filter can include a dual-common port multi-low pass filter (LPF) or a dual-common port multi-high pass filter (LPF). Each of the BPFs within the multi-filter package can be configured to pass a selected frequency, such as an uplink band of a selected frequency band, or a downlink band of the selected frequency band. The multi-filter package can have a first common port and a second common port (e.g., on a left and right side of the multi-filter package, respectively). In an example in which the multi-filter package includes two BPFs that are stacked together in a single package, a first common port can have a first signal trace that connects the first common port to an input of a first BPF and an input of a second BPF. Similarly, a second signal trace can connect a second common port to an output of the first BPF and an output of the second BPF. In this example, the two BPFs can be positioned close to each other (e.g., less than 1 millimeter (mm) from each other for SAW/BAW filters or less than 10 mm for ceramic filters), and the two BPFs can be designed such that one of the BPFs can have a lower return loss in a selected frequency band (i.e. passband), while the other BPF can have a higher return loss (or poor return loss) on that same frequency band (i.e., stopband).

Thus, when an input signal enters the multi-filter package, the input signal can effectively "see" both of the BPFs. The signal can effectively travel towards a first BPF and a second BPF in the multi-filter package. However, the signal will take the path with the lower return loss or lower resistance between the available paths. In other words, when a passband signal enters the multi-filter package, the signal will effectively "see a wall" on one side of the multi-filter package (which corresponds to the path with higher return loss or higher resistance) and an open path on the other side of the multi-filter package (which corresponds to a path with a lower return loss or lower resistance).

While the term "input" and "output" are used with respect to a BPF, the terms are not intended to be limiting. A BPF may be configured to have a signal enter the input of the BPF and exit the output. Alternatively, a signal may enter the output of the BPF and exit the input. Thus, the terms "input" and "output" may be used interchangeably.

In one example, the BPFs in the multi-filter package can include SAW filters, BAW filters, ceramic filters, high pass filters (HPF), low pass filters (LPF), and/or discrete filters (e.g., composed of capacitors and inductors).

In one example, an input signal can have a signal associated with a selected frequency band. For example, a band 2 uplink (UL) signal can include a signal within the 3GPP LTE band 2 UL frequency range. A multi-filter package can include a band 2 UL bandpass filter, configured to pass signals within a frequency range of the band 2 UL range, and reject signals outside of this band. The multi-filter package can also include a band 4 UL bandpass filter, configured to pass signals within a frequency range of the 3GPP LTE band 4 UL frequency range, and reject signals outside of this band.

As an example, the multi-filter package can include a B1 UL BPF and a B2 UL BPF. If the signal that enters the multi-filter package is a B1 UL signal, the signal can pass through the B1 UL BPF in the multi-filter package due to the lower return loss that is designed in the B1 UL BPF for the frequency range of the B1 UL signal. Similarly, if the signal that enters the multi-filter package is a B2 UL signal, the signal can pass through the B2 UL BPF in the multi-filter package due to the lower return loss that is designed in the B2 UL BPF for the frequency range of the B2 UL signal. In addition, if the B1 UL signal or the B2 UL signal were to go to the B2 UL BPF or the B1 UL BPF, respectively, the UL signal would get reflected back and would then pass through the appropriate UL BPF.

In one example, the multi-filter package can include electrically short wires or signal traces that connect the first common port and the second common port to the first and second BPFs. In other words, the path from the first common port to the input of the first and second BPFs, and the path from the second common port to the output of the first and second BPFs can be electrically short. In one example, if the wires or signal traces were to become electrically long, the wires or signal traces can create phase and reflection problems. Thus, by keeping the wires or signal traces electrically short, these problems can be avoided and the signal can only travel on an incorrect path for a reduced period of time.

In one example, the electrically short wires or signal traces in the multi-filter package can be shorter than $\frac{1}{10}$ or $\frac{1}{20}$ or $\frac{1}{100}$ of a wavelength of the signal the electrically short wires are carrying. In one example, a 1 GHz wavelength is 300 mm, and the electrically short wires or signal traces can be shorter than 3 mm. Since the wires or signal traces are considerably shorter than the wavelength, an incoming signal can effectively see multiple paths at the same time, and the incoming signal can travel on a path with lower return loss or lower resistance.

In one example, the multi-filter package can include multiple separate bandpass filters, with each bandpass filter configured for a separate frequency band. Each separate frequency band can have a guard band between the frequency band (i.e. the frequency bands are non-adjacent). Each of the bandpass filters can be designed to have an input that is impedance matched to a first common port, and an output that is impedance matched to a second common port.

In another example, it can be difficult for multiple different bandpass filters, each with different passbands, to each be impedance matched to a common port. To overcome that limitation, the multi-filter package can include one or more matching networks. For example, a matching network can be coupled to inputs of two or more BPFs in the multi-filter package. A separate matching network can be coupled to the outputs of two or more BPFs in the multi-filter package. The matching network(s) can each be a separate module that is external to the BPFs, but within the multi-filter package. The matching network(s) can include series inductors and/or shunt capacitors, which can function to impedance match the inputs of the BPFs in the multi-filter package to the first common port and/or impedance match the outputs of the BPFs in the multi-filter package to the second common port. The impedance matching can be between a common port and each individual BPF port. In other words, each BPF can be matched to a common port, and not to other BPFs. The impedance matching provided by the matching network(s) can enable a signal to travel through a BPF on a lower return loss path in the multi-filter package and bypass a BPF on a higher return loss path of the multi-filter package. Depending on the combination of BPFs in the multi-filter package, the matching implementation can be designed accordingly.

As used herein, the term "coupled" typically refers to two devices that are directly electrically connected. The term "communicatively coupled" refers to two devices that are electrically connected, with additional electrical components located between the two devices. However, the terms are meant to be descriptive and are not intended to be limiting. The terms "coupled" and "communicatively coupled" may be used interchangeably.

In one configuration, two or more sets of BPFs can be packaged together or connected to form a multi-common port multi-filter package (e.g., a DISO filter package). For example, a first set of BPFs consisting of two or more BPFs can be connected to a second set of BPFs consisting of one or more BPFs. The first set of BPFs can include DL BPFs and the second set of BPFs can include UL BPFs, or vice versa. The multi-filter package can include a first common port that connects to the first and second set of BPFs, a second common port that connects to the first set of BPFs and a third common port that connects to the second set of BPFs. The wires or signal traces that connect the first, second, and third common ports to each BPF in the first and second sets of BPFs, respectively, can be electrically short. In addition, the multi-filter package can include a matching network that is coupled to the first set of BPFs in the multi-filter package and/or a matching network that is coupled to the second set of BPFs in the multi-filter package.

As an example, the multi-filter package can include a first set of BPFs that includes a B2 UL BPF and a B4 UL BPF, as well as a second set of BPFs that includes a B12 DL BPF and a B13 DL BPF. Due to the matching network(s) and the electrically short wires or signal traces, a signal that enters the multi-filter package can pass through an appropriate BPF and bypass the other BPFs in the multi-filter package. For example, an UL signal will pass through one of the UL BPFs with a passband within the signal's band, and bypass the DL BPFs. Similarly, a DL signal will pass through one of the DL BPFs associated with the signal's band, and bypass the UL BPFs. Furthermore, due to the use of matching network(s) and the electrically short wires or signal traces, an UL signal can pass through an appropriate UL BPF and bypass other UL BPFs in the multi-filter package, and similarly, a DL signal can pass through an appropriate DL BPF and bypass other DL BPFs in other frequency bands in the multi-filter package.

FIGS. 15A to 15D illustrate examples of dual-common port multi-filter packages. One or more multi-filter package(s) 1500 can be included in a repeater (i.e. signal booster or bidirectional amplifier). The multi-filter package 1500 can be communicatively coupled to a first interface port of the repeater. The first interface port can communicate one or more signals that include multiple bands. Each signal may communicate a single band, or multiple bands.

Figure 15A:
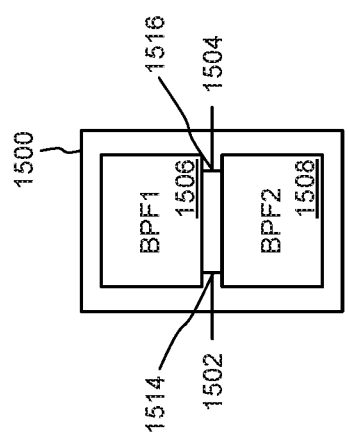
FIGS. 15A to 15D illustrate multi-filter packages in accordance with an example.

As shown in FIG. 15A, the multi-filter package 1500 can include a first common port 1502 and a second common port 1504. The first common port 1502 can be coupled to the first interface port and an input to two or more filters in the multi-filter package 1500, such as a first BPF (BPF1) 1506 and a second BPF (BPF2) 1508 in the multi-filter package 1500. The first BPF (BPF1) 1506 and the second BPF (BPF2) 1508 can be configured to filter one or more bands in one or more signals. The second common port 1504 can be coupled to a second interface port of the repeater, where the second interface can communicate the one or more signals, as well as to an output of the two or more filters in the multi-filter package 1500.

In one example, as shown in FIG. 15A, the multi-filter package 1500 can include a first signal trace 1514 and a second signal trace 1516. The first signal trace 1514 can be coupled between the first common port 1502, and then divide to couple to the input of the two or more filters in the multi-filter package 1500. Furthermore, the second signal trace 1516 can be coupled between the second common port 1504, and then divide to couple to the output of the two or more filters in the multi-filter package 1500.

In one example, a length of the first signal trace 1514 from the first common port 1502 to the input to each of the two or more filters in the multi-filter package 1500 can have a substantially equal length (e.g., less than 5 mm in length with a difference in length of less than +/−0.25 mm). In another example, a length of the second signal trace 1516 from the second common port 1504 to the output of each of the two or more filters in the multi-filter package 1500 can have a substantially equal length (e.g., less than 5 mm in length with a difference of less than +/−0.25 mm). In yet another example, a length of each of the first signal trace 1514 and the second signal trace 1516 can be less than 2 millimeters (mm) in length.

In one example, the multi-filter package 1500 can be associated with at least one of a high band frequency or a low band frequency, wherein the high band frequency includes 3GPP LTE band 4 (B4) and band 25 (B25), and the low band frequency includes 3GPP LTE band 5 (B5), band 12 (B12) and band 13 (B13).

In one example, as shown in FIG. 15A, the multi-filter package 1500 can include two or more impedance-matched uplink bandpass filters for two or more uplink bands, respectively. Alternatively, the multi-filter package 1500 can include two or more impedance-matched downlink bandpass filters for two or more downlink bands, respectively. The impedance-matched filters can each have an input 1514 that is impedance matched to the first common port 1502, and an output 1516 that is impedance matched to the second common port 1504.

Figure 15D:
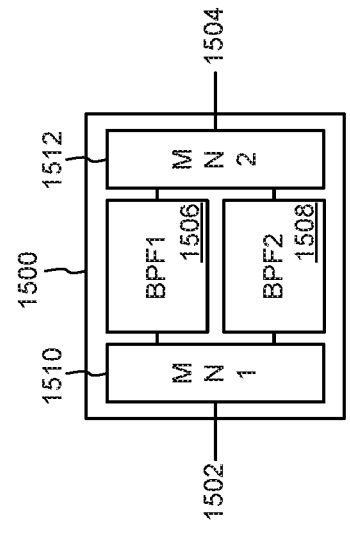
Figure 15C:
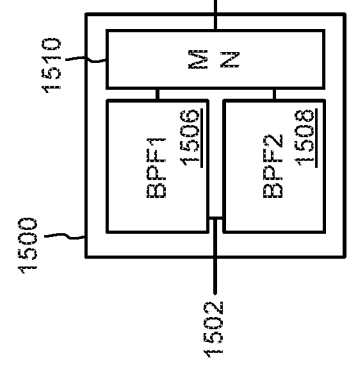
Figure 15B:
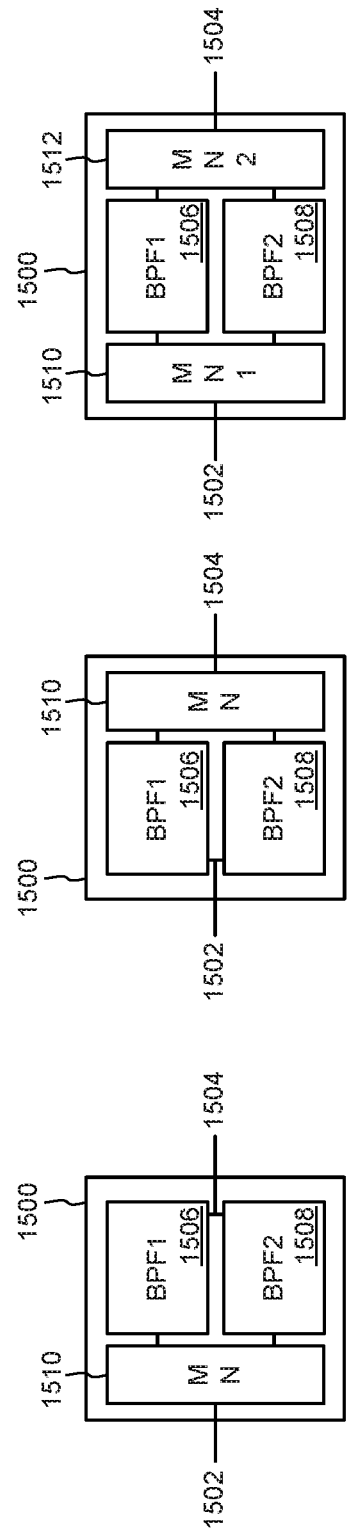

In one example, as shown in FIG. 15B, the multi-filter package 1500 can include a matching network 1510. The matching network 1510 can be coupled to an input of the two or more filters in the multi-filter package 1500, such as the first BPF (BPF1) 1506 and the second BPF (BPF2) 1508 in the multi-filter package 1500. The matching network 1510 can be configured to impedance match the input of each of the two or more filters in the multi-filter package 1500 to the first common port 1502.

In one example, as shown in FIG. 15C, the multi-filter package 1500 can include a matching network 1510. The matching network 1510 can be coupled to the output of the two or more filters in the multi-filter package 1500, such as the first BPF (BPF1) 1506 and the second BPF (BPF2) 1508 in the multi-filter package 1500. The matching network 1510 can be operable to impedance match the two or more filters in the multi-filter package 1500.

In one example, each filter in the multi-filter package 1500 (e.g., the first BPF (BPF1) 1506 and the second BPF (BPF2) 1508) can have an input that is impedance matched to inputs of other filters in the multi-filter package 1500 and/or each filter in the multi-filter package 1500 can have an output that is impedance matched to outputs of other filters in the multi-filter package 1500.

In one example, as shown in FIG. 15D, the multi-filter package 1500 can include a first matching network 1510 and a second matching network 1512. The first matching network 1510 can be coupled to the input of the two or more filters in the multi-filter package 1500, such as the first BPF (BPF1) 1506 and the second BPF (BPF2) 1508 in the multi-filter package 1500, and the second matching network 1512 can be coupled to the output of the two or more filters in the multi-filter package 1500. Each of the matching networks can impedance match the input/output to the associated common port.

In one configuration, as shown in FIGS. 15A to 15D, multi-filter package(s) 1500 can include an impedance-matched filter set (e.g., the first BPF (BPF1) 1506 and the second BPF (BPF2) 1508) with the first common port 1502 and the second common port 1504.

In one example, the impedance-matched filter set can refer to a set of two or more filters in the multi-filter package 1500, wherein each filter in the set can have filter input that is impedance matched with a common port and a filter output that is impedance matched with a separate common port. The impedance matching can be accomplished at the filter, or using an impedance matching network within the multi-filter package 1500 that is coupled to the set of two or more filters, to enable a single common input and a single common output for the impedance-matched filter set. Accordingly, the multi-filter package 1500 can be configured to separately filter each of the bands of a signal with two or more downlink bands or two or more uplink bands.

Figure 16D:
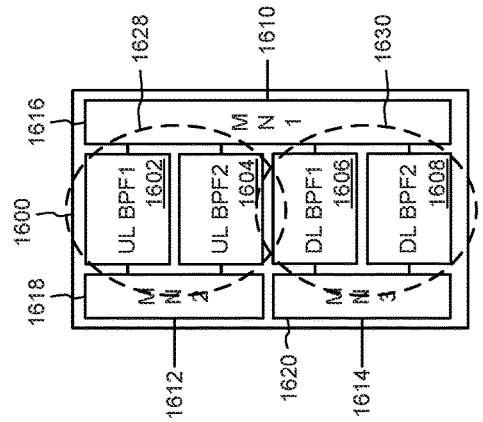
FIGS. 16A to 16D illustrate multi-filter packages in accordance with an example.
Figure 16A:
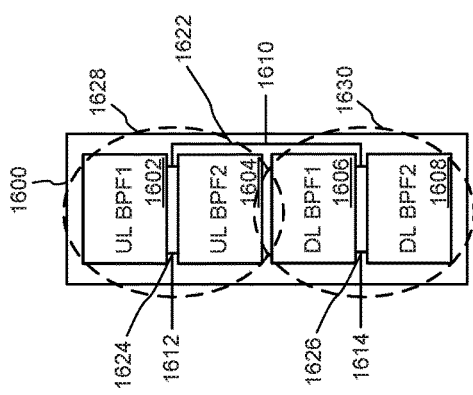

FIGS. 16A to 16D illustrate examples of multi-common port multi-filter packages. One or more multi-filter package(s) 1600 can be included in a repeater (i.e. signal booster or bidirectional amplifier). The multi-filter package 1600 can be communicatively coupled to a first interface port of the repeater. As shown in FIG. 16A, the multi-filter package 1600 can include a first common port 1610, a second common port 1612, and a third common port 1614. The first common port 1610 can be communicatively coupled to the first interface port of the repeater. The first common port 1610 can also be communicatively coupled to a first set of filters 1628 in the multi-filter package 1600, such as a first UL BPF (UL BPF1) 1602 and a second UL BPF (UL BPF2) 1604, as well as to a second set of filters 1630 in the multi-filter package 1600, such as a first DL BPF (DL BPF1) 1606 and a second DL BPF (DL BPF2) 1608. Furthermore, the second common port 1612 can be communicatively coupled to a second interface port of the repeater and the first set of filters 1628 in the multi-filter package 1600. The third common port 1614 can be communicatively coupled to the second interface port of the repeater and the second set of filters 1630 in the multi-filter package 1600.

In one example, as shown in FIG. 16A, the multi-filter package 1600 can include a first signal trace 1622, a second signal trace 1624 and a third signal trace 1626. The first signal trace 1622 can be coupled between the first common port 1610, and each filter in the first set of filters 1628 and each filter in the second set of filters 1630 in the multi-filter package 1600. The second signal trace 1624 can be coupled between the second common port 1612, and each filter in the first set of filters 1628 in the multi-filter package 1600. The third signal trace 1626 can be coupled between the third common port 1614, and each filter in the second set of filters 1630 in the multi-filter package 1600.

In one example, a length of the first signal trace 1622 from the first common port 1610 to each filter in the first set of filters 1628 and the second set of filters 1630 in the multi-filter package 1600 can have a substantially equal length (e.g., less than 10 mm+/−0.5 mm or less than 5 mm+/−0.25 mm). In another example, a length of the second signal trace 1624 from the second common port 1612 to each filter in the first set of filters 1628 in the multi-filter package 1600 can have a substantially equal length (e.g., less than 5 mm+/−0.25 mm). In yet another example, a length of the third signal trace 1626 from the third common port 1614 to each filter in the second set of filters 1630 in the multi-filter package 1600 can have a substantially equal length (e.g., less than 5 mm+/−0.25 mm). In a further example, a length of each of the first signal trace 1622, the second signal trace 1624 and the third signal trace 1626 can be less than 10 mm+/−0.5 mm or less than 5 mm+/−0.25 mm.

Figure 16C:
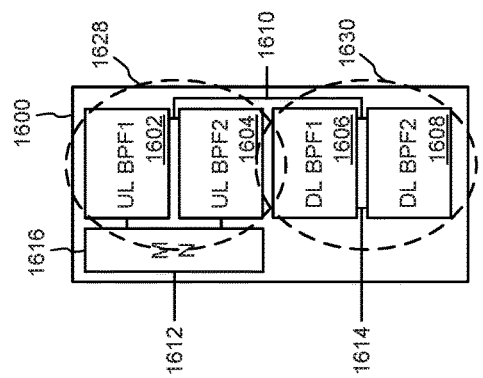
Figure 16B:
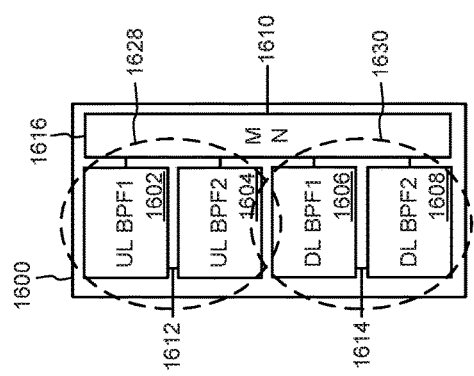

In one example, as shown in FIG. 16B, the first common port 1610 can be coupled to a matching network 1616. The matching network 1616 can be coupled to the first set of filters 1628 in the multi-filter package 1600, such as the first UL BPF (UL BPF1) 1602 and the second UL BPF (UL BPF2) 1604, as well as the second set of filters 1630 in the multi-filter package 1600, such as the first DL BPF (DL BPF1) 1606 and the second DL BPF (DL BPF2) 1608. Each BPF in the multi-filter package 1600 can be configured to filter one or more bands in one or more signals. Each of the bands can be non-spectrally adjacent, as previously discussed. The matching network 1616 can be configured to provide impedance matching for the inputs/outputs of the first set of filters 1628 and the second set of filters 1630 in the multi-filter package 1600 with the first common port 1610. Furthermore, in this example, the second common port 1612 and the third common port 1614 may not be coupled to matching networks. Accordingly, the input/outputs of the first set of BPFs 1628 can be impedance matched to the common port 1616. The input/outputs of the second set of BPFs 1630 can be impedance matched to the third common port 1614.

In one example, as shown in FIG. 16C, the second common port 1612 can be coupled to a matching network 1616. In this example, the matching network 1616 can be coupled to and impedance matched with the inputs/outputs of the first set of filters 1628 in the multi-filter package 1600, such as the first UL BPF (UL BPF1) 1602 and the second UL BPF (UL BPF2) 1604. Alternatively, or in addition, the third common port 1614 can be coupled to the matching network 1616. The matching network 1616 can be coupled to and impedance matched with the inputs/outputs of the second set of filters 1630 in the multi-filter package 1600, such as the first DL BPF (DL BPF1) 1606 and the second DL BPF (DL BPF2) 1608.

In this example, the first common port 1610 and the third common port 1614 may not be coupled to matching networks. Accordingly, the first common port 1610 may be impedance matched directly to the inputs/outputs of the UL BPF1 1602, UL BPF2 1604, DL BPF1 1606, and DL BPF2 1608. In addition, the third common port 1614 may be impedance matched directly to the inputs/outputs of the DL BPF1 1606 and DL BPF2 1608.

In one example, as shown in FIG. 16D, the first common port 1610 can be coupled to a first matching network 1616, the second common port 1612 can be coupled to a second matching network 1618, and the third common port 1614 can be coupled to a third matching network 1620. The first matching network 1616 can be coupled to and impedance matched with the inputs/outputs of the first set of filters 1628 in the multi-filter package 1600, such as the first UL BPF (UL BPF1) 1602 and the second UL BPF (UL BPF2) 1604, as well as the second set of filters 1630 in the multi-filter package 1600, such as the first DL BPF (DL BPF1) 1606 and the second DL BPF (DL BPF2) 1608. The second matching network 1618 can be coupled to and impedance matched with the inputs/outputs of the first set of filters 1628 in the multi-filter package 1600. The third matching network 1620 can be coupled to and impedance matched with the inputs/outputs of the second set of filters 1630 in the multi-filter package 1600.

In one example, each filter in the multi-filter package 1600 can have an input that is impedance matched to one or more of a first, second, or third common port of the multi-filter package 1600 and/or each filter in the multi-filter package 1600 can have an output that is impedance matched to another of the first, second, or third common port in the multi-filter package 1600.

In one configuration, as shown in FIGS. 16A to 16D, multi-filter package(s) 1600 can include a first impedance-matched filter set (e.g., the first set of filters 1628), and a second impedance-matched filter set (e.g., the second set of filters 1630). The first common port 1610 can be coupled to the first and the second impedance-matched filter sets, the second common port 1612 can be coupled to the first impedance-matched filter set, and the third common port 1614 can be coupled to the second impedance-matched filter set. In one example, the multi-filter package 1600 can include two or more impedance-matched uplink bandpass filters, with each uplink bandpass filter configured to pass one or more uplink bands, respectively, and two or more impedance-matched downlink bandpass filters, with each bandpass filter configured to pass one or more downlink bands, respectively. Accordingly, the multi-filter package 1600 can be configured to separately filter each of the bands of a signal with two or more downlink bands and two or more uplink bands.

In one example, a signal booster (or repeater) can include a combination of the multi-filter package(s) 1500 shown in FIGS. 15A to 15D and the multi-filter package(s) 1600 shown in FIGS. 16A to 16D.

FIGS. 17A to 17D illustrate examples of multi-common port multi-filter packages. Each multi-filter package can include at least a first common port, a second common port and a third common port. Furthermore, each multi-filter package can include a first set of filters, such as a first UL BPF and a second UL BPF, as well as a second set of filters, such as a first DL BPF and a second DL BPF. The multi-filter package may or may not include one or more matching networks. A matching network can be coupled to the first and/or second set of filters on a first common port side of the multi-filter package and/or on a second/third common port side of the multi-filter package.

The terms SISO filter and dual-common port multi-filter package 1500, as illustrated in the examples of FIGS. 15A-15D, are synonymous. The multi-filter package 1500 can be configured for use as SISO filters, as illustrated in the examples of FIGS. 3-14 and described in the preceding paragraphs. Similarly, the multi-common port multi-filter packages 1600, as illustrated in the examples of FIGS. 16A-16D and 17A-17D, are synonymous with DISO filters. The multi-filter package 1600, 1700 can be configured for use as DISO filters, as illustrated in the examples of FIGS. 4-14, and described in the preceding paragraphs.

Figure 18:
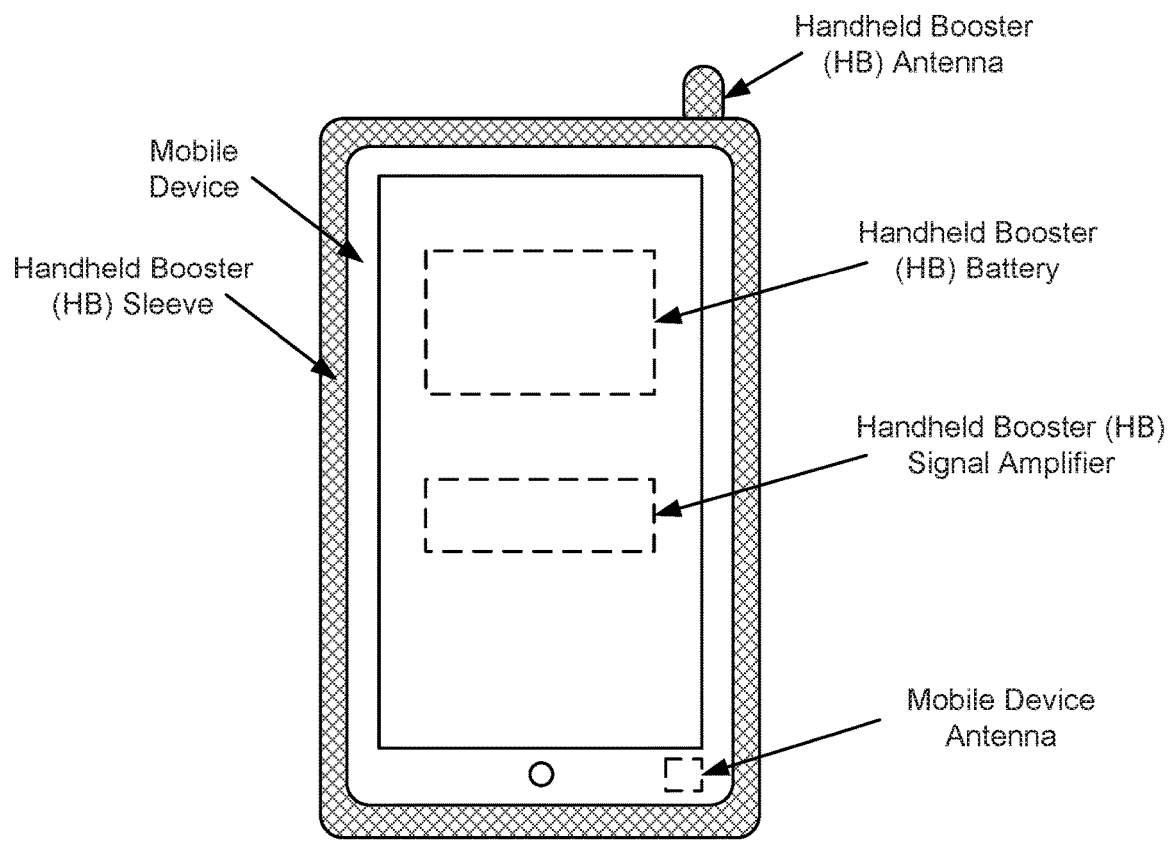
FIG. 18 illustrates a handheld booster in communication with a wireless device in accordance with an example.

FIG. 18 illustrates an exemplary handheld booster in communication with a mobile device. More specifically, the mobile device can be within a handheld booster (HB) sleeve. The HB sleeve can include a handheld booster (HB) antenna. The HB antenna can receive uplink signals from a mobile device antenna associated with the mobile device. The HB antenna can transmit the uplink signals to a base station. In addition, the HB antenna can receive downlink signals from the base station. The HB antenna can transmit the downlink signals to the mobile device antenna associated with the mobile device. In addition, the HB sleeve can include a HB battery to power the HB sleeve and/or the mobile device. Furthermore, the HB sleeve can include a HB signal amplifier to amplify downlink and/or uplink signals communicated from the mobile device and/or the base station.

Figure 19:
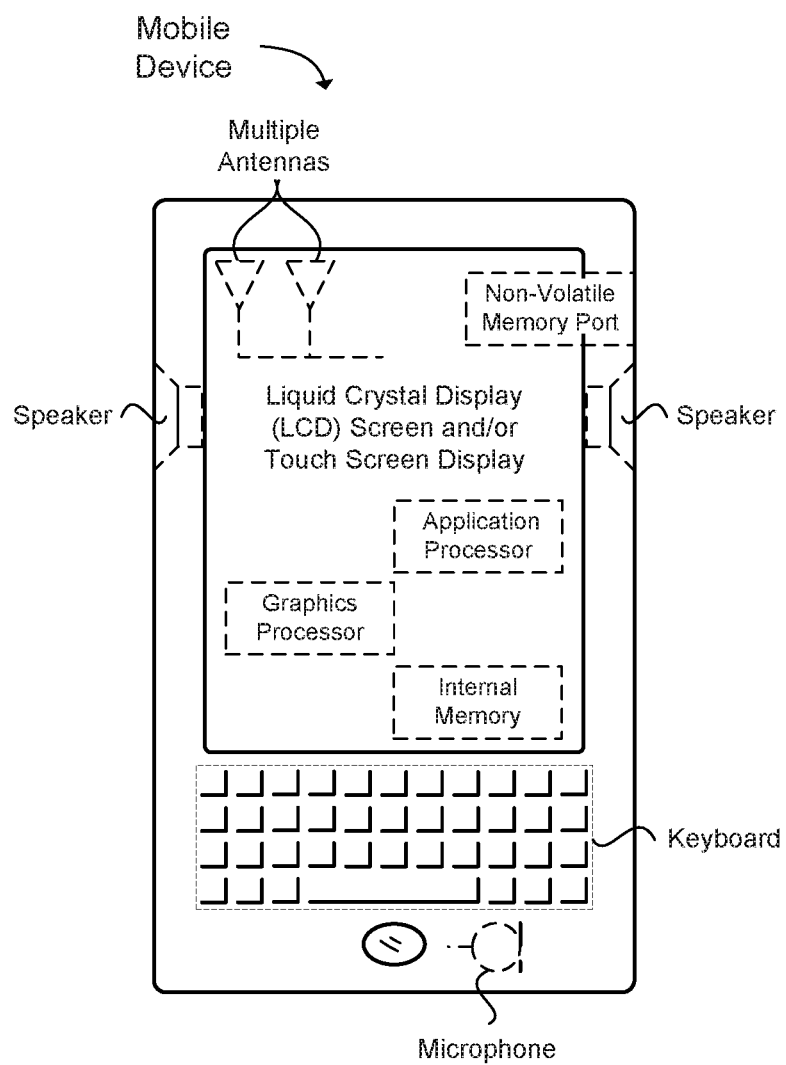
FIG. 19 illustrates a wireless device in accordance with an example.

FIG. 19 provides an example illustration of the wireless device, such as a user equipment (UE), a mobile station (MS), a mobile communication device, a tablet, a handset, a wireless transceiver coupled to a processor, or other type of wireless device. The wireless device can include one or more antennas configured to communicate with a node or transmission station, such as an access point (AP), a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or other type of wireless wide area network (WWAN) access point. The wireless device can communicate using separate antennas for each wireless communication standard or shared antennas for multiple wireless communication standards. The wireless device can communicate in a wireless local area network (WLAN), a wireless personal area network (WPAN), and/or a WWAN.

FIG. 19 also provides an illustration of a microphone and one or more speakers that can be used for audio input and output from the wireless device. The display screen can be a liquid crystal display (LCD) screen, or other type of display screen such as an organic light emitting diode (OLED) display. The display screen can be configured as a touch screen. The touch screen can use capacitive, resistive, or another type of touch screen technology. An application processor and a graphics processor can be coupled to internal memory to provide processing and display capabilities. A non-volatile memory port can also be used to provide data input/output options to a user. The non-volatile memory port can also be used to expand the memory capabilities of the wireless device. A keyboard can be with the wireless device or wirelessly connected to the wireless device to provide additional user input. A virtual keyboard can also be provided using the touch screen.

EXAMPLES

The following examples pertain to specific technology embodiments and point out specific features, elements, or actions that can be used or otherwise combined in achieving such embodiments.

Example 1 includes a repeater, comprising: a first interface port to receive signals on multiple bands; a first multiband filter communicatively coupled to the first interface port, the first multiband filter configured to filter signals on two or more non-spectrally adjacent bands; a first amplifier communicatively coupled to the first multiband filter, the first amplifier configured to amplify filtered signals; and a second interface port communicatively coupled to the first amplifier, the second interface port configured to communicate amplified filtered signals.

Example 2 includes the repeater of Example 1, further comprising: a second multiband filter communicatively coupled to the first interface port, the second multiband filter configured to filter signals on two or more non-spectrally adjacent bands; and a second amplifier communicatively coupled to the second multiband filter, the second amplifier configured to amplify the filtered signals, wherein the second interface port is communicatively coupled to the second amplifier.

Example 3 includes the repeater of any of Examples 1 to 2, further comprising: a first diplexer communicatively coupled to the first interface port, the first multiband filter, and the second multiband filter, wherein the first diplexer is configured to communicate signals to the first multiband filter and signals to the second multiband filter; and a second diplexer communicatively coupled to the second interface port, the first multiband filter and the second multiband filter, wherein the second diplexer is configured to communicate signals from the first multiband filter and signals from the second multiband filter to the second interface port.

Example 4 includes the repeater of any of Examples 1 to 3, wherein the first multiband filter and the first amplifier are on a high band frequency signal path and the second multiband filter and the second amplifier are on a low band frequency signal path.

Example 5 includes the repeater of any of Examples 1 to 4, wherein the multiband filter comprises a plurality of band pass filters in a single package, the plurality of band pass filters being impedance matched to enable operation in the single package.

Example 6 includes the repeater of any of Examples 1 to 5, wherein the multiband filter is a single-input single-output (SISO) multiband filter or a double-input single-output (DISO) multiband filter.

Example 7 includes the repeater of any of Examples 1 to 6, wherein the first interface port is coupled to a first antenna and the second interface port is coupled to a second antenna or a modem.

Example 8 includes the repeater of any of Examples 1 to 7, further comprising a detector to detect a power level of the signals on multiple bands, wherein the first multiband filter is bypassed when the power level of the signals is below a defined threshold.

Example 9 includes the repeater of any of Examples 1 to 8, wherein the first multiband signal is associated with at least one of a high band frequency or a low band frequency, wherein the high band frequency includes band 4 (B4) and band 25 (B25) and the low band frequency includes band 12 (B12), band 13 (B13) and band 5 (B5).

Example 10 includes the repeater of any of Examples 1 to 9, wherein the repeater is included in a sleeve that is attached to a wireless device.

Example 11 includes a signal booster comprising: a first interface port to receive signals on multiple bands; a first multiband filter configured to filter signals on two or more non-spectrally adjacent bands; a first amplifier configured to amplify filtered signals; and a second interface port configured to communicate amplified filtered signals.

Example 12 includes the signal booster of Example 11, further comprising: a second multiband filter configured to filter signals on two or more non-spectrally adjacent bands; a first diplexer configured to direct signals from the first interface port to the first multiband filter; a second diplexer configured to direct signals from the second interface port to the second multiband filter; and a second amplifier configured to amplify filtered signals.

Example 13 includes the signal booster of any of Examples 11 to 12, further comprising a third multiband filter communicatively coupled to the first multiband filter and a fourth multiband filter communicatively coupled to the second multiband filter.

Example 14 includes the signal booster of any of Examples 11 to 13, wherein: the first multiband filter, the first amplifier and the third multiband filter are on a high band frequency signal path; and the second multiband filter, the second amplifier and the fourth multiband filter are on a low band frequency signal path.

Example 15 includes the signal booster of any of Examples 11 to 14, wherein each of the first, second, third and fourth multiband filters comprise a plurality of band pass filters in a single package, the plurality of band pass filters being impedance matched to enable operation in the single package.

Example 16 includes the signal booster of any of Examples 11 to 15, wherein each of the first, second, third and fourth multiband filters are single-input single-output (SISO) multiband filters or dual-input single-output (DISO) multiband filters.

Example 17 includes the signal booster of any of Examples 11 to 16, wherein the first interface port is coupled to a first antenna and the second interface port is coupled to a second antenna.

Example 18 includes the signal booster of any of Examples 11 to 17, wherein the first antenna is configured to receive the signals from a base station, wherein the second antenna is configured to communicate amplified filtered signals to a wireless device.

Example 19 includes the signal booster of any of Examples 11 to 18, wherein the second antenna is configured to receive signals from a wireless device, wherein the first antenna is configured to communicate amplified filtered signals to a base station.

Example 20 includes a radio frequency (RF) filter comprising: a first interface port to receive signals on multiple bands; a multiband filter communicatively coupled to the first interface port, the multiband filter configured to filter signals on two or more non-spectrally adjacent bands; and a second interface port communicatively coupled to the multiband filter to communicate the filtered signals on the multiple bands.

Example 21 includes the RF filter of Example 20, further comprising an amplifier communicatively coupled to the multiband filter, the amplifier configured to amplify the filtered signals.

Example 22 includes a radio frequency (RF) filter comprising: a first interface port to receive signals on multiple bands; a first multiband filter communicatively coupled to the first interface port, the first multiband filter configured to filter signals on two or more non-spectrally adjacent bands; a second interface port to receive signals on multiple bands; and a second multiband filter communicatively coupled to the second interface port, the second multiband filter configured to filter signals on two or more non-spectrally adjacent bands.

Example 23 includes the RF filter of Example 22, further comprising a first amplifier communicatively coupled to the first multiband filter, the first amplifier configured to amplify the filtered signals; and a second amplifier communicatively coupled to the second multiband filter, the second amplifier configured to amplify the filtered signals.

Example 24 includes a repeater, comprising: a first interface port to communicate two or more signals that include multiple bands with guard bands between the multiple bands; a second interface port to communicate the two or more signals; a dual-common port multi-bandpass filter communicatively coupled to the first interface port, the dual-common port multi-bandpass filter comprising: a first common port coupled to the first interface port and an input to each of two or more analog filters in the dual-common port multi-bandpass filter, wherein each analog filter in the dual-common port multi-bandpass filter is configured to filter one or more bands in the two or more signals; and a second common port coupled to the second interface port and an output of each of the two or more analog filters in the dual-common port multi-bandpass filter; and an amplifier communicatively coupled between the first interface port and the second interface port.

Example 25 includes the repeater of Example 24, wherein the dual-common port multi-bandpass filter further comprises a matching network communicatively coupled to one or more of: the input to each of the two or more analog filters in the dual-common port multi-bandpass filter; or the output of each of the two or more analog filters in the dual-common port multi-bandpass filter, wherein the matching network is operable to impedance match the two or more analog filters in the dual-common port multi-bandpass filter to operate together with the first common port or the second common port.

Example 26 includes the repeater of any of Examples 24 to 25, wherein each analog filter in the dual-common port multi-bandpass filter has an input that is impedance matched to the first common port while coupled to the inputs of other analog filters in the dual-common port multi-bandpass filter, and each analog filter in the dual-common port multi-bandpass filter has an output that is impedance matched to the second common port while coupled to the outputs of other analog filters in the dual-common port multi-bandpass filter.

Example 27 includes the repeater of any of Examples 24 to 26, wherein the dual-common port multi-bandpass filter further comprises: a first signal trace that is coupled between the first common port, and divides to couple to the input to each of the two or more analog filters in the dual-common port multi-bandpass filter; and a second signal trace that is coupled between the second common port, and divides to couple to the output of each of the two or more analog filters in the dual-common port multi-bandpass filter.

Example 28 includes the repeater of any of Examples 24 to 27, wherein a length of each of the first signal trace and the second signal trace is less than 5 millimeters (mm).

Example 29 includes the repeater of any of Examples 24 to 28, wherein: a length of the first signal trace from the first common port to the input to each of the two or more analog filters has a substantially equal length; and a length of the second signal trace from the second common port to the output of each of the two or more analog filters has a substantially equal length.

Example 30 includes the repeater of any of Examples 24 to 29, further comprising a signal path between the first interface port and the second interface port that includes the dual-common port multi-bandpass filter, wherein the signal path is an uplink signal path or a downlink signal path.

Example 31 includes the repeater of any of Examples 24 to 30, further comprising a signal path between the first interface port and the second interface port that includes the dual-common port multi-bandpass filter, wherein the signal path is a high band frequency signal path or a low band frequency signal path.

Example 32 includes the repeater of any of Examples 24 to 31, wherein: the first interface port is communicatively coupled to a first antenna; and the second interface port is communicatively coupled to a second antenna.

Example 33 includes the repeater of any of Examples 24 to 32, wherein the dual-common port multi-bandpass filter is associated with at least one of a high band frequency or a low band frequency, wherein the high band frequency includes third generation partnership project (3GPP) long term evolution (LTE) band 4 (B4) and band 25 (B25), and the low band frequency includes 3GPP LTE band 5 (B5), band 12 (B12) and band 13 (B13).

Example 34 includes a repeater, comprising: a first interface port to communicate two or more signals that include multiple bands with guard bands between the multiple bands; a second interface port to communicate the two or more signals; a first multi-common port multi-bandpass filter communicatively coupled to the first interface port, the first multi-common port multi-bandpass filter comprising: a first common port coupled to the first interface port and a first matching network, wherein the first matching network is coupled to: a first set of two or more analog filters in the first multi-common port multi-bandpass filter; and a second set of one or more analog filters in the first multi-common port multi-bandpass filter; a second common port communicatively coupled to the second interface port and the first set of two or more analog filters in the first multi-common port multi-bandpass filter; and a third common port communicatively coupled to the second interface port and the second set of one or more analog filters in the first multi-common port multi-bandpass filter, wherein each analog filter in the first multi-common port multi-bandpass filter is configured to filter one or more bands in the two or more signals; a first-direction amplifier communicatively coupled on a first-direction signal path between the second interface port and the second common port; and a second-direction amplifier communicatively coupled on a second-direction signal path between the second interface port and the third common port.

Example 35 includes the repeater of Example 34, wherein the first multi-common port multi-bandpass filter further comprises a second matching network coupled to one or more of the first set of two or more analog filters in the first multi-common port multi-bandpass filter or the second set of one or more analog filters in the first multi-common port multi-bandpass filter.

Example 36 includes the repeater of any of Examples 34 to 35, wherein the first multi-common port multi-bandpass filter further comprises: a second matching network coupled to the first set of two or more analog filters in the first multi-common port multi-bandpass filter; and a third matching network coupled to the second set of one or more analog filters in the first multi-common port multi-bandpass filter.

Example 37 includes the repeater of any of Examples 34 to 36, wherein each analog filter in the first multi-common port multi-bandpass filter has an input that is impedance matched to one of the first common port, the second common port or the third common port while coupled to inputs of other analog filters in the first multi-common port multi-bandpass filter, and each analog filter in the first multi-common port multi-bandpass filter has an output that is impedance matched to one of the first common port, the second common port or the third common port while coupled to outputs of other analog filters in the first multi-common port multi-bandpass filter.

Example 38 includes the repeater of any of Examples 34 to 37, further comprising a second multi-common port multi-bandpass filter communicatively coupled to the second interface port, the second multi-common port multi-bandpass filter comprising: a first common port coupled to the second interface port and a fourth matching network, wherein the fourth matching network is coupled to: a first set of two or more filters in the second multi-common port multi-bandpass filter; and a second set of one or more filters in the second multi-common port multi-bandpass filter; a second common port communicatively coupled to the first interface port and the first set of two or more filters in the second multi-common port multi-bandpass filter; and a third common port communicatively coupled to the first interface port and the second set of one or more filters in the second multi-common port multi-bandpass filter, wherein each filter in the second multi-common port multi-bandpass filter is configured to filter one or more bands in the one or more signals.

Example 39 includes the repeater of any of Examples 34 to 38, wherein the first multi-common port multi-bandpass filter further comprises: a first signal trace that is coupled between the first common port, and divides to couple to each analog filter in the first set of two or more analog filters and each analog filter in the second set of one or more analog filters in the first multi-common port multi-bandpass filter; a second signal trace that is coupled between the second common port, and divides to couple to each analog filter in the first set of two or more analog filters in the first multi-common port multi-bandpass filter; and a third signal trace that is coupled between the third common port, and divides to couple to each analog filter in the second set of one or more analog filters in the first multi-common port multi-bandpass filter.

Example 40 includes the repeater of any of Examples 34 to 39, wherein a length of each of the first signal trace, the second signal trace and the third signal trace is less than 5 millimeters (mm).

Example 41 includes the repeater of any of Examples 34 to 40, wherein: a length of the first signal trace from the first common port to each filter in the first set of two or more filters and the second set of one or more filters in the first multi-common port multi-bandpass filter has a substantially equal length; a length of the second signal trace from the second common port to each filter in the first set of two or more filters in the first multi-common port multi-bandpass filter has a substantially equal length; and a length of the third signal trace from the third common port to each filter in the second set of one or more filters in the first multi-common port multi-bandpass filter has a substantially equal length.

Example 42 includes the repeater of any of Examples 34 to 41, wherein: the first-direction signal path is an uplink signal path or a downlink signal path; and the second-direction signal path is an uplink signal path or a downlink signal path.

Example 43 includes the repeater of any of Examples 34 to 42, wherein: the first-direction signal path is a high band frequency signal path or a low band frequency signal path; and the second-direction signal path is a high band frequency signal path or a low band frequency signal path.

Example 44 includes the repeater of any of Examples 34 to 43, wherein the first multi-common port multi-bandpass filter is associated with at least one of a high band frequency or a low band frequency, wherein the high band frequency includes third generation partnership project (3GPP) long term evolution (LTE) band 4 (B4) and band 25 (B25), and the low band frequency includes 3GPP LTE band 5 (B5), band 12 (B12) and band 13 (B13).

Example 45 includes a repeater, comprising: a first interface port to communicate one or more signals that include multiple bands with guard bands between the multiple bands; a second interface port to communicate the one or more signals; a first multi-common port multi-bandpass filter communicatively coupled to the first interface port, the first multi-common port multi-bandpass filter comprising: a first impedance-matched filter set; a second impedance-matched filter set; a first common port coupled to first interface port and the first and the second impedance-matched filter sets; a second common port coupled to the first impedance-matched filter set; a third common port coupled to the second impedance-matched filter set; a second multi-common port multi-bandpass filter communicatively coupled to the second interface port, the second multi-common port multi-bandpass filter comprising: a first impedance-matched filter set; a second impedance-matched filter set; a first common port coupled to the second interface port and the first and the second impedance-matched filter sets; a second common port coupled to the first impedance-matched filter set; a third common port coupled to the second impedance-matched filter set; a first-direction amplifier communicatively coupled on a first-direction signal path between the second common port of the first multi-common port multi-bandpass filter and the second common port of the second multi-common port multi-bandpass filter; and a second-direction amplifier communicatively coupled on a second-direction signal path between the third common port of the first multi-common port multi-bandpass filter and the third common port of the second multi-common port multi-bandpass filter.

Example 46 includes the repeater of Example 45, further comprising a third multi-common port multi-bandpass filter including: an impedance-matched filter set with a first common port and a second common port, wherein the first common port of the third multi-common port multi-bandpass filter is communicatively coupled to the second common port of the first multi-common port multi-bandpass filter and the second common port of the third multi-common port multi-bandpass filter is communicatively coupled to the second common port of the second multi-common port multi-bandpass filter.

Example 47 includes the repeater of any of Examples 45 to 46, further comprising a fourth multi-common port multi-bandpass filter including: an impedance-matched filter set with a first common port and a second common port, wherein the first common port of the fourth multi-common port multi-bandpass filter is communicatively coupled to the third common port of the first multi-common port multi-bandpass filter and the second common port of the fourth multi-common port multi-bandpass filter is communicatively coupled to the third common port of the second multi-common port multi-bandpass filter.

Example 48 includes the repeater of any of Examples 45 to 47, wherein the first multi-common port multi-bandpass filter and the second multi-common port multi-bandpass filter each include two or more impedance-matched uplink bandpass filters for two or more uplink bands, respectively, and two or more impedance-matched downlink bandpass filters for two or more downlink bands, respectively.

Example 49 includes the repeater of any of Examples 45 to 48, wherein the third multi-common port multi-bandpass filter includes two or more impedance-matched uplink bandpass filters for two or more uplink bands, respectively.

Example 50 includes the repeater of any of Examples 45 to 49, wherein the fourth multi-common port multi-bandpass filter includes two or more impedance-matched downlink bandpass filters for two or more downlink bands, respectively.

Example 51 includes the repeater of any of Examples 45 to 50, wherein: the first interface port is configured to be communicatively coupled to a first antenna; and the second interface port is configured to be communicatively coupled to a second antenna.

Example 52 includes a dual-common port multi-bandpass filter, comprising: two or more analog filters; a first common port coupled to an input of each of the two or more analog filters, wherein each analog filter is configured to filter one or more frequency bands; and a second common port coupled to an output of each of the two or more analog filters; wherein each input of each of the two or more analog filters is impedance matched with the first common port; and wherein each output of each of the two or more analog filters is impedance matched with the second common port.

Example 53 includes the dual-common port multi-bandpass filter of Example 52, wherein the dual-common port multi-bandpass filter further comprises a matching network communicatively coupled to one or more of: the input to each of the two or more analog filters in the dual-common port multi-bandpass filter; or the output of each of the two or more analog filters in the dual-common port multi-bandpass filter, wherein the matching network is operable to impedance match the two or more analog filters in the dual-common port multi-bandpass filter to operate together with the first common port or the second common port.

Example 54 includes the dual-common port multi-bandpass filter of any of Examples 52 to 53, wherein each analog filter in the dual-common port multi-bandpass filter has an input that is impedance matched to the first common port while coupled to the inputs of other analog filters in the dual-common port multi-bandpass filter, and each analog filter in the dual-common port multi-bandpass filter has an output that is impedance matched to the second common port while coupled to the outputs of other analog filters in the dual-common port multi-bandpass filter.

Example 55 includes the dual-common port multi-bandpass filter of any of Examples 52 to 54, wherein the dual-common port multi-bandpass filter further comprises: a first signal trace that is coupled between the first common port, and divides to couple to the input to each of the two or more analog filters in the dual-common port multi-bandpass filter; and a second signal trace that is coupled between the second common port, and divides to couple to the output of each of the two or more analog filters in the dual-common port multi-bandpass filter.

Example 57 includes a multi-common port multi-bandpass filter, comprising: a first common port coupled to a first matching network, wherein the first matching network is coupled to: a first set of two or more analog filters in the multi-common port multi-bandpass filter; and a second set of one or more analog filters in the multi-common port multi-bandpass filter; a second common port coupled to the first set of two or more analog filters in the multi-common port multi-bandpass filter; and a third common port coupled to the second set of one or more analog filters in the multi-common port multi-bandpass filter, wherein each analog filter in the multi-common port multi-bandpass filter is configured to filter one or more frequency bands.

Example 58 includes the multi-common port multi-bandpass filter of Example 57, wherein the multi-common port multi-bandpass filter further comprises a second matching network coupled to one or more of the first set of two or more analog filters in the multi-common port multi-bandpass filter or the second set of one or more analog filters in the multi-common port multi-bandpass filter.

Example 59 includes the multi-common port multi-bandpass filter of any of Examples 57 to 58, wherein the multi-common port multi-bandpass filter further comprises: a second matching network coupled to the first set of two or more analog filters in the multi-common port multi-bandpass filter; and a third matching network coupled to the second set of one or more analog filters in the multi-common port multi-bandpass filter.

Example 60 includes the multi-common port multi-bandpass filter of any of Examples 57 to 59, wherein the each analog filter in the multi-common port multi-bandpass filter has an input that is impedance matched to one of the first common port, the second common port or the third common port while coupled to inputs of other analog filters in the multi-common port multi-bandpass filter, and each analog filter in the multi-common port multi-bandpass filter has an output that is impedance matched to one of the first common port, the second common port or the third common port while coupled to outputs of other analog filters in the multi-common port multi-bandpass filter.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. The low energy fixed location node, wireless device, and location server can also include a transceiver module (i.e., transceiver), a counter module (i.e., counter), a processing module (i.e., processor), and/or a clock module (i.e., clock) or timer module (i.e., timer). One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A repeater, comprising:
   a first interface port to communicate two or more signals that include multiple bands with one or more guard bands between the multiple bands;
   a second interface port to communicate the two or more signals;
   a dual-common port multi-bandpass filter communicatively coupled to the first interface port, the dual-common port multi-bandpass filter comprising:
      a first common port coupled to the first interface port and an input to each of two or more analog filters in the dual-common port multi-bandpass filter, wherein each analog filter in the dual-common port multi-bandpass filter is configured to filter one or more bands in the two or more signals; and
      a second common port coupled to the second interface port and an output of each of the two or more analog filters in the dual-common port multi-bandpass filter; and
   an amplifier communicatively coupled between the first interface port and the second interface port.

2. The repeater of claim 1, wherein the dual-common port multi-bandpass filter further comprises a matching network communicatively coupled to one or more of:
   the input to each of the two or more analog filters in the dual-common port multi-bandpass filter; or
   the output of each of the two or more analog filters in the dual-common port multi-bandpass filter,
   wherein the matching network is operable to impedance match the two or more analog filters in the dual-common port multi-bandpass filter to operate together with the first common port or the second common port.

3. The repeater of claim 1, wherein each analog filter in the dual-common port multi-bandpass filter has an input that is impedance matched to the first common port while coupled to the inputs of other analog filters in the dual-common port multi-bandpass filter, and each analog filter in the dual-common port multi-bandpass filter has an output that is impedance matched to the second common port while coupled to the outputs of other analog filters in the dual-common port multi-bandpass filter.

4. The repeater of claim 1, wherein the dual-common port multi-bandpass filter further comprises:
   a first signal trace that is coupled between the first common port, and divides to couple to the input to each of the two or more analog filters in the dual-common port multi-bandpass filter; and
   a second signal trace that is coupled between the second common port, and divides to couple to the output of each of the two or more analog filters in the dual-common port multi-bandpass filter.

5. The repeater of claim 4, wherein a length of each of the first signal trace and the second signal trace is less than 5 millimeters (mm).

6. The repeater of claim 4, wherein:
a length of the first signal trace from the first common port to the input to each of the two or more analog filters has a substantially equal length; and
a length of the second signal trace from the second common port to the output of each of the two or more analog filters has a substantially equal length.

7. The repeater of claim 1, further comprising a signal path between the first interface port and the second interface port that includes the dual-common port multi-bandpass filter, wherein the signal path is an uplink signal path or a downlink signal path.

8. The repeater of claim 1, further comprising a signal path between the first interface port and the second interface port that includes the dual-common port multi-bandpass filter, wherein the signal path is a high band frequency signal path or a low band frequency signal path.

9. The repeater of claim 1, wherein:
the first interface port is communicatively coupled to a first antenna; and
the second interface port is communicatively coupled to a second antenna.

10. The repeater of claim 1, wherein the dual-common port multi-bandpass filter is associated with at least one of a high band frequency or a low band frequency, wherein the high band frequency includes third generation partnership project (3GPP) long term evolution (LTE) band 4 (B4) and band 25 (B25), and the low band frequency includes 3GPP LTE band 5 (B5), band 12 (B12) and band 13 (B13).

11. A repeater, comprising:
a first interface port to communicate two or more signals that include multiple bands with one or more guard bands between the multiple bands;
a second interface port to communicate the two or more signals;
a first multi-common port multi-bandpass filter communicatively coupled to the first interface port, the first multi-common port multi-bandpass filter comprising:
a first common port coupled to the first interface port and a first matching network, wherein the first matching network is coupled to:
a first set of two or more analog filters in the first multi-common port multi-bandpass filter; and
a second set of one or more analog filters in the first multi-common port multi-bandpass filter;
a second common port communicatively coupled to the second interface port and the first set of two or more analog filters in the first multi-common port multi-bandpass filter; and
a third common port communicatively coupled to the second interface port and the second set of one or more analog filters in the first multi-common port multi-bandpass filter,
wherein each analog filter in the first multi-common port multi-bandpass filter is configured to filter one or more bands in the two or more signals;
a first-direction amplifier communicatively coupled on a first-direction signal path between the second interface port and the second common port; and
a second-direction amplifier communicatively coupled on a second-direction signal path between the second interface port and the third common port.

12. The repeater of claim 11, wherein the first multi-common port multi-bandpass filter further comprises a second matching network coupled to one or more of the first set of two or more analog filters in the first multi-common port multi-bandpass filter or the second set of one or more analog filters in the first multi-common port multi-bandpass filter.

13. The repeater of claim 11, wherein the first multi-common port multi-bandpass filter further comprises:
a second matching network coupled to the first set of two or more analog filters in the first multi-common port multi-bandpass filter; and
a third matching network coupled to the second set of one or more analog filters in the first multi-common port multi-bandpass filter.

14. The repeater of claim 11, wherein each analog filter in the first multi-common port multi-bandpass filter has an input that is impedance matched to one of the first common port, the second common port or the third common port while coupled to inputs of other analog filters in the first multi-common port multi-bandpass filter, and each analog filter in the first multi-common port multi-bandpass filter has an output that is impedance matched to one of the first common port, the second common port or the third common port while coupled to outputs of other analog filters in the first multi-common port multi-bandpass filter.

15. The repeater of claim 11, further comprising a second multi-common port multi-bandpass filter communicatively coupled to the second interface port, the second multi-common port multi-bandpass filter comprising:
a first common port coupled to the second interface port and a fourth matching network, wherein the fourth matching network is coupled to:
a first set of two or more analog filters in the second multi-common port multi-bandpass filter; and
a second set of one or more analog filters in the second multi-common port multi-bandpass filter;
a second common port communicatively coupled to the first interface port and the first set of two or more analog filters in the second multi-common port multi-bandpass filter; and
a third common port communicatively coupled to the first interface port and the second set of one or more analog filters in the second multi-common port multi-bandpass filter,
wherein each analog filter in the second multi-common port multi-bandpass filter is configured to filter one or more bands in the two or more signals.

16. The repeater of claim 11, wherein the first multi-common port multi-bandpass filter further comprises:
a first signal trace that is coupled between the first common port, and divides to couple to each analog filter in the first set of two or more analog filters and each analog filter in the second set of one or more analog filters in the first multi-common port multi-bandpass filter;
a second signal trace that is coupled between the second common port, and divides to couple to each analog filter in the first set of two or more analog filters in the first multi-common port multi-bandpass filter; and
a third signal trace that is coupled between the third common port, and divides to couple to each analog filter in the second set of one or more analog filters in the first multi-common port multi-bandpass filter.

17. The repeater of claim 16, wherein a length of each of the first signal trace, the second signal trace and the third signal trace is less than 5 millimeters (mm).

18. The repeater of claim 16, wherein:
a length of the first signal trace from the first common port to each analog filter in the first set of two or more analog filters and the second set of one or more analog filters in the first multi-common port multi-bandpass filter has a substantially equal length;

a length of the second signal trace from the second common port to each analog filter in the first set of two or more analog filters in the first multi-common port multi-bandpass filter has a substantially equal length; and a length of the third signal trace from the third common port to each analog filter in the second set of one or more analog filters in the first multi-common port multi-bandpass filter has a substantially equal length.

19. The repeater of claim 11, wherein:
the first-direction signal path is an uplink signal path or a downlink signal path; and
the second-direction signal path is an uplink signal path or a downlink signal path.

20. The repeater of claim 11, wherein:
the first-direction signal path is a high band frequency signal path or a low band frequency signal path; and
the second-direction signal path is a high band frequency signal path or a low band frequency signal path.

21. The repeater of claim 11, wherein the first multi-common port multi-bandpass filter is associated with at least one of a high band frequency or a low band frequency, wherein the high band frequency includes third generation partnership project (3GPP) long term evolution (LTE) band 4 (B4) and band 25 (B25), and the low band frequency includes 3GPP LTE band 5 (B5), band 12 (B12) and band 13 (B13).

22. A repeater, comprising:
a first interface port to communicate two or more signals that include multiple bands with one or more guard bands between the multiple bands;
a second interface port to communicate the two or more signals;
a first multi-common port multi-filter communicatively coupled to the first interface port, the first multi-common port multi-bandpass filter comprising:
a first impedance-matched filter set;
a second impedance-matched filter set;
a first common port coupled to first interface port and the first and the second impedance-matched filter sets;
a second common port coupled to the first impedance-matched filter set;
a third common port coupled to the second impedance-matched filter set;
a second multi-common port multi-bandpass filter communicatively coupled to the second interface port, the second multi-common port multi-bandpass filter comprising:
a first impedance-matched filter set;
a second impedance-matched filter set;
a first common port coupled to the second interface port and the first and the second impedance-matched filter sets;
a second common port coupled to the first impedance-matched filter set;
a third common port coupled to the second impedance-matched filter set;
a first-direction amplifier communicatively coupled on a first-direction signal path between the second common port of the first multi-common port multi-bandpass filter and the second common port of the second multi-common port multi-bandpass filter; and
a second-direction amplifier communicatively coupled on a second-direction signal path between the third common port of the first multi-common port multi-bandpass filter and the third common port of the second multi-common port multi-bandpass filter.

23. The repeater of claim 22, further comprising a third multi-common port multi-bandpass filter including: an impedance-matched filter set with a first common port and a second common port, wherein the first common port of the third multi-common port multi-bandpass filter is communicatively coupled to the second common port of the first multi-common port multi-bandpass filter and the second common port of the third multi-common port multi-bandpass filter is communicatively coupled to the second common port of the second multi-common port multi-bandpass filter.

24. The repeater of claim 22, further comprising a fourth multi-common port multi-bandpass filter including: an impedance-matched filter set with a first common port and a second common port, wherein the first common port of the fourth multi-common port multi-bandpass filter is communicatively coupled to the third common port of the first multi-common port multi-bandpass filter and the second common port of the fourth multi-common port multi-bandpass filter is communicatively coupled to the third common port of the second multi-common port multi-bandpass filter.

25. The repeater of claim 22, wherein the first multi-common port multi-bandpass filter and the second multi-common port multi-bandpass filter each include two or more impedance-matched uplink bandpass filters for two or more uplink bands, respectively, and two or more impedance-matched downlink bandpass filters for two or more downlink bands, respectively.

26. The repeater of claim 23, wherein the third multi-common port multi-bandpass filter includes two or more impedance-matched uplink bandpass filters for two or more uplink bands, respectively.

27. The repeater of claim 24, wherein the fourth multi-common port multi-bandpass filter includes two or more impedance-matched downlink bandpass filters for two or more downlink bands, respectively.

28. The repeater of claim 22, wherein:
the first interface port is configured to be communicatively coupled to a first antenna; and
the second interface port is configured to be communicatively coupled to a second antenna.

* * * * *